United States Patent
Lehane et al.

(10) Patent No.: US 9,268,321 B2
(45) Date of Patent: Feb. 23, 2016

(54) DIGITAL TIGGERING USING FINITE STATE MACHINES

(71) Applicants: Keysight Technologies, Inc., Minneapolis, MN (US); Agilent Technologies, Inc., Loveland, CO (US)

(72) Inventors: Andrew Robert Lehane, Milnathort (GB); Antony J. A. Kirkham, Edinburgh (GB); Lee A. Barford, San Jose, CA (US)

(73) Assignee: Keysight Technologies, Inc., Santa Rosa, CA (US)

( * ) Notice: Subject to any disclaimer, the term of this patent is extended or adjusted under 35 U.S.C. 154(b) by 20 days.

(21) Appl. No.: 14/313,884

(22) Filed: Jun. 24, 2014

(65) Prior Publication Data
US 2015/0370234 A1    Dec. 24, 2015

(51) Int. Cl.
| | |
|---|---|
| *G06F 7/38* | (2006.01) |
| *G01R 13/02* | (2006.01) |
| *G05B 19/045* | (2006.01) |
| *G04F 10/00* | (2006.01) |

(52) U.S. Cl.
CPC ............ *G05B 19/045* (2013.01); *G04F 10/005* (2013.01); *G01R 13/0272* (2013.01); *H03M 2201/192* (2013.01)

(58) Field of Classification Search
USPC .............................. 326/96; 702/66–67, 70, 74
See application file for complete search history.

(56) References Cited

U.S. PATENT DOCUMENTS

| | | | | | |
|---|---|---|---|---|---|
| 4,858,142 | A | * | 8/1989 | Jenq ................... | G01R 31/3177 324/76.15 |
| 6,473,701 | B1 | * | 10/2002 | Tallman ............. | G01R 13/0272 324/121 R |
| 7,133,463 | B1 | * | 11/2006 | Amirkhany ........... | G06F 17/141 370/210 |
| 2003/0210487 | A1 | * | 11/2003 | Oda ........................ | G11B 5/09 360/27 |

* cited by examiner

*Primary Examiner* — Douglas W Owens
*Assistant Examiner* — James H Cho

(57) ABSTRACT

An apparatus that can be configured for various functions such as a digital oscilloscope, logic analyzer or frequency analyzer is disclosed. The apparatus includes a symbol generator, a multi-symbol FSM, and a controller. The symbol generator generates an ordered sequence of symbols from an ordered sequence of digital values. The symbol generator generates one symbol corresponding to each of the digital values. The digital values have a greater number of possible values than the symbols. The controller causes the multi-symbol FSM to search for a pattern in the sequence of symbols that identifies a corresponding pattern in the sequence of digital values. A portion of the digital sequence is then displayed based on the location of the pattern in the sequence of symbols.

17 Claims, 25 Drawing Sheets

DIGITAL TIGGERING USING FINITE STATE MACHINES

BACKGROUND

Measurement instruments that measure, record, process a signal, and display the results of the processing are known to the art. For example, a digital oscilloscope measures the amplitude of a signal as a function of time and displays a portion of the observed signal as a graph of signal amplitude as a function of time. Modern digital oscilloscopes can measure a signal at a rate of close to 100 Gigasamples/sec in each of a plurality of measurement channels. The signal is typically digitized using a bank of sample and hold circuits that sample the signal in successive time slots. Each sample and hold circuit feeds a high speed analog-to-digital converter (ADC) that stores its output in a high speed memory bank that is assigned to that ADC.

Only a small fraction of this recorded data can be displayed at a time, and hence, some form of trigger is needed to define the beginning of the measurements of interest that are to be displayed. In many cases, the user is trying to visualize the signal in regions that satisfy some particular criterion. The criteria of interest can be complex patterns. For example, the user may wish to examine the signal in a region that follows three pulses having specified pulse widths. Hence, the trigger must be able to detect the occurrence of the three pulses.

Unfortunately, prior art triggering schemes that are capable of detecting such complex patterns cannot operate at anything close to the sample rates discussed above, and hence, a two-step triggering system is often employed. To provide a complex trigger, a first trigger that can operate in real time (RTT) is used to control the data that is stored in memory. The RTT is typically implemented in special high-speed hardware that operates on the input signal. This type of trigger is limited to simple patterns such as detecting a rising or falling edge in the input signal. In practice, the digital oscilloscope takes samples continuously and stores these in a circular memory buffer. When a trigger pattern is detected, the digital oscilloscope continues to acquire data for some predetermined period of time that is limited by the buffer size. Data acquisition is then halted to provide time for a slower pattern recognition program that can detect the more complex pattern of interest to examine the stored signal values for the more complex trigger pattern of interest. This type of program is often referred to as a post acquisition trigger (PAT). If the pattern is found, the data from the trigger point onward is then displayed for the user. If the pattern is not found, data acquisition is recommenced and the processes are repeated. During the time in which the PAT is operating, the digital oscilloscope is not acquiring new data, and hence, the digital oscilloscope is "blind". The blind time is typically a large fraction of the total operating time, and hence, signals of interest can be lost. Hence, it would be advantageous to provide a PAT that operates at higher speeds. Ideally, the PAT would operate in real time, and hence, avoid the two trigger scheme discussed above.

SUMMARY

The present invention includes an apparatus and method for using the same. The apparatus can be configured for various functions such as a digital oscilloscope or a frequency analyzer. The apparatus includes a symbol generator, a multi-symbol finite state machine (MSFSM), and a controller. The symbol generator generates an ordered sequence of symbols from an ordered sequence of digital values. The symbol generator generates one symbol corresponding to each of the digital values. The digital values have a greater number of possible values than the symbols. The MSFSM is characterized by an input word, and a plurality of finite state machine (FSM) states. The MSFSM changes from a current one of the FSM states to another one of the FSM states that is determined by the input word and the current one of the states in response to a cycle signal being received. The controller causes the MSFSM to search for a pattern in the ordered sequence of symbols. The controller loads the input word with a plurality of the symbols, generates the cycle signal, and couples the cycle signal to the MSFSM.

In one aspect of the invention, the apparatus also includes a digital sequence generator, a memory, and a display processor. The digital sequence generator receives an analog input signal that varies as a function of time and generates the ordered sequence of digital values therefrom. The memory stores the ordered sequence of digital values. The display processor generates a visual display based on the digital sequence of digital values in the memory. The display is generated in response to the MSFSM generating a signal indicating that the MSFSM entered a predetermined state.

In a still further aspect of the invention, the apparatus includes a user interface, and a library of signal patterns, each signal pattern specifying a set of states for the MSFSM. One of the signal patterns is selected in response to input from a user of the apparatus through the user interface.

In another aspect of the invention, the symbol generator receives each digital value generated by the digital sequence generator prior to the sequence of digital values being stored in the memory. In an alternative aspect, the symbol generator receives the sequence of digital values from the memory in response to a command from the controller.

In a still further aspect of the invention, the apparatus includes a trigger generator that receives the analog signal and generates a trigger signal responsive to a pattern in the analog signal. The controller causes the MSFSM to search for a predetermined pattern in the sequence of symbols in response to the trigger signal.

In another aspect of the invention, the digital sequence generator includes a plurality of ADC channels, each ADC channel including an ADC and a memory module. The ADC channels sample the analog input signal in a predetermined order. Each ADC channel stores digital values generated by that ADC channel in the memory module in that ADC channel. In this aspect, the input word to the MSFSM is loaded with symbols generated from digital values that were generated by different ADC channels.

In a still further aspect of the invention, the MSFSM includes a plurality of parallel processing FSMs. In one embodiment, each of the plurality of parallel processing FSMs has an input word that is one of the symbols in the input word of the MSFSM.

DETAILED DESCRIPTION

Figure 1:
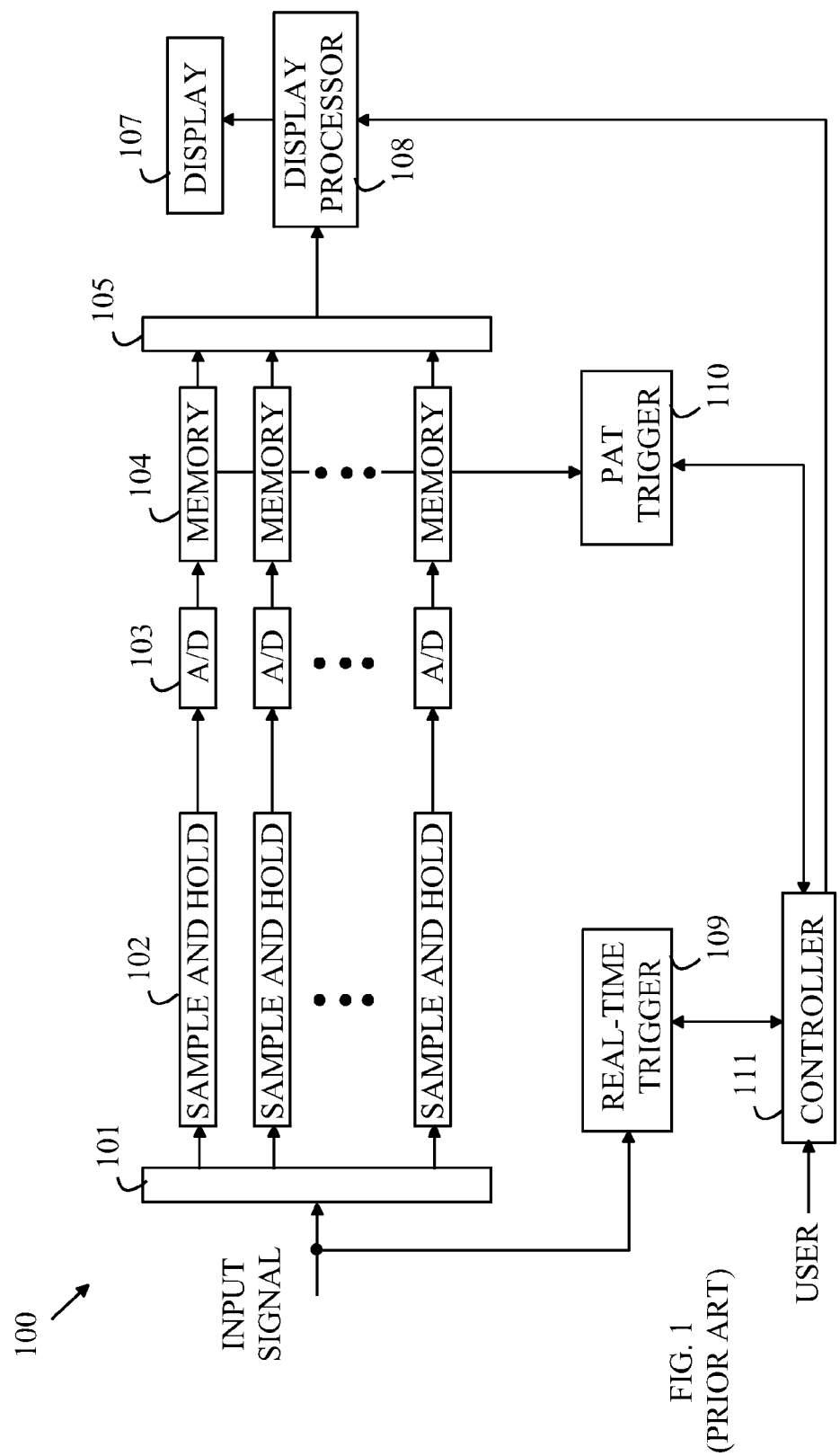
FIG. 1 illustrates a prior art digital oscilloscope.

The manner in which the present invention provides its advantages can be more easily understood with reference to FIG. 1, which illustrates a prior art digital oscilloscope. Digital oscilloscope 100 displays a portion of an input signal on a display 107. The portion of the input signal that is displayed is determined by trigger criteria that are input by a user to a controller 111. The input signal is digitized and stored using a bank of sample and hold circuits of which sample and hold circuit 102 is typical. The sample and hold circuits are loaded sequentially using a multiplexer 101 that connects the input signal received on an input port sequentially to the various sample and hold circuits. Display processor 108 accesses the memory banks using a second multiplexer 105. To simplify the drawing the control circuitry that operates multiplexer 101 has been omitted from the drawing. For the purposes of the present discussion, it is sufficient to note that the sample and hold circuits are connected in sequence until the last sample and hold circuit is connected and then the process is repeated starting with the first sample and hold circuit. There is one ADC and memory bank associated with each sample and hold circuit. The ADC and memory bank corresponding to sample and hold circuit 102 are shown at 103 and 104, respectively. The ADCs and memory banks operating in parallel have sufficient bandwidth to process the signal in the corresponding sample and hold circuits and store the result in the memory banks. However, the circuitry/software needed to detect complex trigger patterns cannot operate at speeds that match the data acquisition rates of the bank of ADCs and sample and hold circuits. It should be noted that the sample and hold circuits can be viewed as part of the ADCs. Hence, to simplify the following discussion, it will be assumed that the sample and hold circuits are part of the ADCs unless the context indicates otherwise.

To accommodate the inability of the complex trigger circuitry to keep up with the data acquisition rate of the bank of ADCs, the trigger criterion is typically divided into an RTT that is processed by RTT circuit 109 and a trigger pattern processor 110. The RTT operates in real time from the input signal and comprises a relatively small number of simple trigger criteria such as a rising or falling edge. The RTT operative at any given time is specified by the user. When the RTT fires, controller 111 allows the input signal to be processed until the memory banks are full and then stops the processing of further samples. Once the RTT fires, the PAT processor examines the contents of the memory banks to determine if the trigger specified by the PAT is satisfied. If so, the controller causes display processor 108 to display data in the memory banks starting with a sample that corresponds to a signal time specified by the PAT. As noted above, once the memory banks are filled after the RTT is satisfied, no further data is acquired until the PAT is finished making its trigger determination.

In one aspect of the present invention, the trigger generation is performed using an FSM. An FSM is characterized by a plurality of FSM states and an input word. At any given time, the FSM is one of the FSM states, referred to as the current FSM state. When the FSM receives a cycle signal, the FSM moves from the current state to a new state based on the contents of the input word and the current state. In some cases, the new state may be the current state; however, there will always be at least one transition in which the FSM moves to a different state in any FSM of interest. The FSM also reports certain transitions. In one type of FSM, the FSM also has one or more states, referred to as reporting states. When the FSM moves to a reporting state, the FSM generates a special signal, referred to as a match state. In a second type of FSM, the FSM reports when it makes a specified transition from the current state.

In one embodiment, the FSM replaces the conventional PAT in a digital oscilloscope in a manner that allows more complex patterns to be defined. In addition, this type of embodiment can significantly increase the processing speed of the PAT relative to prior art PATs that are implemented in software, and hence, reduce the dead time associated with such triggering schemes. In another embodiment, the FSM replaces the conventional RTTs, thereby allowing real time triggering on complex patterns.

In principle, an FSM can be used to search for any pattern that can be defined by a regular expression. For the purposes of the present discussion, a regular expression is defined to be a sequence of characters that defines a search pattern. Given a regular expression, an FSM that executes the search so defined exists, and there are procedures for automatically generating that FSM. It should also be noted that there is more than one FSM that is capable of performing the search for any given regular expression.

An FSM is a machine that has a plurality of states connected by "directed edges". At each processing cycle, the FSM moves from its current state to a next state when a new input word is received by the FSM. Hence, each edge has one or more input values associated with that edge. When the FSM receives an input word having a value equal to the value on an edge, and the FSM is in the state associated with the input side of the edge, the FSM changes to the state associated with the output side of the edge. The FSM then proceeds to process the next input word. As noted above, certain transitions give rise to the FSM reporting the identity of the state that it has just entered or the transition that was just taken, and any other information associated with that state or transition. The transition may be the entry into a particular state or the entry into that state by a specified edge. For the purposes of the present discussion, the processing cycle is complete when the FSM has moved to its new state and made any required reports.

While the use of an FSM for executing a PAT has been suggested, there are significant challenges in implementing a search with an FSM when the input words are digitized signal values. An FSM is typically implemented by a table lookup on a relatively simple computational platform. In each processing cycle, the FSM receives an input word and examines a table corresponding to the current state of the FSM which specifies the next state for the FSM for each possible input word. The memory needed to store the table can be as high as the number of possible input word values times the number of possible states in the FSM. The output of the ADCs in a digital oscilloscope are typically 12 or more bits in length. Regular expressions dealing with such large input words present significant problems both in terms of the memory required to implement an FSM with a 12 bit input word and in defining simple conceptual patterns such as a rising edge in a signal of this precision is difficult, particularly in the presence of noise.

As noted above, the memory requirements of an FSM depend on the size of the input word. An FSM is typically implemented using a table for each state of the FSM. The processing done by each state includes examining the input word received while the FSM is in that state and determining the next state for the FSM based on that input word. In the simplest case, a lookup table is typically used to implement this processing. The size of the input table is the number of possible input words multiplied by the number of states in the FSM. For 12 bit input words, there are 4096 ($2^{12}$) rows in this table for each state, and hence, the memory requirements become excessive as the size of the input word increases. Furthermore, there is a tradeoff between speed and the required memory. To improve the speed at which the FSM operates, an FSM that operates on multiple input words is required, which increases the effective size of the input word. For example, a two symbol MSFSM using a 12 bit sample word in which two 12 bit samples are processed as a single input word would require $2^{24}$ rows in each table. While there are schemes that can be used to reduce the memory requirements, these schemes increase the processing time for each input word.

The second significant problem is the processing time for implementing a search with an FSM. Moving the processing from a conventional software PAT to a generic FSM does not provide sufficient improvement in the dead time associated with a PAT. The time needed for the FSM to perform the search is determined by the time to sequentially access the memory in the digital oscilloscope. As noted above, the individual memories in the digital oscilloscope have bandwidths that are a small fraction of the data acquisition bandwidth, the acquisition system loads the memories in parallel to increase the bandwidth of each individual memory and hence, sequential access limits the improvement in the PAT operating time unless those symbols/samples can also be processed in parallel.

In one aspect of the present invention, the trigger patterns are specified in terms of "symbols" that have significantly fewer possible values than the output of the ADCs in the digital oscilloscope. Each symbol represents a range of ADC values. For example, the ADC values could be mapped to a symbol set having three values denoted by L, M, H. In one example of such a symbol set, ADC values that are less than or equal to some threshold value, l, are mapped to L; ADC values that are greater than 0, but less than or equal to a second threshold value, h, are mapped to M; and ADC values that are greater than h are mapped to H. The search pattern is then defined in terms of a regular expression that operates on the symbols rather than the ADC values.

For the purposes of the present discussion, it is useful to separate the types of patterns that can be represented by regular expressions into two classes. These classes can be more easily understood in terms of an input string that consists of letters of the alphabet. The first class will be referred to as "fixed patterns". For example, a text string could be searched for the pattern "var=x". A fixed pattern has a known fixed length and is satisfied by only one pattern in the input stream. The second class of patterns will be referred to as "variable patterns". These patterns have unknown lengths or are satisfied by a number of different strings. For example, "var=[a-z]+;" is satisfied by any pattern that starts with "var=" followed by one or more up to any number of characters in the lowercase alphabet followed by ";". This pattern generates strings that cannot be predicted in advance in terms of length, no less exact content.

As noted above, a regular expression is defined to be a sequence of characters that defines a search pattern. Each character in the expression is either a regular character with its literal meaning or one of a predetermined number of metacharacters that have a special meaning. For example, the metacharacter "|" denotes an alternative. The regular expression "a|b" is satisfied by a or b. The metacharacters "?", "*", and "+" quantify the preceding element. Metacharacter "?" is satisfied if the preceding element occurs zero or one time, "*" is satisfied if the preceding element occurs zero or more times, and "+" is satisfied if the preceding element occurs one or more times. Many patterns of interest require the repetition of some string. The expression that is to be repeated is surrounded (grouped) by ( ) if there is more than one character, or more than one character range in the expression. Metacharacters "[" and "]" are used to create character classes, such as [LMH], "^" is used to represent negation, i.e., [^L], everything but 'L'. To specify that the expression is to be repeated n times, {n} is used after the expression. To specify a range between n and m, the expression is followed by {n,m}.

In terms of this notation, a regular expression for a rising edge is "L+M*H", i.e., one or more Ls followed by zero or more Ms followed by an H. Similarly, a regular expression for a falling edge is "H+M*L". A regular expression for either a rising or falling edge is (H+M*L)|(L+M*H).

Since the input word to a trigger generator based on such symbols has only three states, the memory requirements for the FSM are relatively modest. While reducing the input word size improves the memory requirements, it does little to improve the processing speed. That is, the cycle time for an FSM operating on input words having three states is essentially the same as that for an FSM operating on input words having 4096 states. The present invention improves the operating speed by using the regular expression that defines a trigger condition operating on one symbol at a time to generate an FSM that operates on an input word having multiple symbols. Since the cycle time is the same for the MSFSM, the effective processing speed is increased by a factor equal to the number of symbols in the input word.

Hence, in a second aspect of the invention, the FSM that operates on the symbols has an input word that consists of a plurality of symbols. The digitized version of the input signal can be viewed as a linear sequence of digital sequence values, the order of the values being the order in which the corresponding signal value was received. The sequence is stored in the multiple memory banks, and hence, is not stored in sequence in the memory. There is a corresponding sequence of symbols, one symbol corresponding to each ADC value. The symbol sequence, S(i), is likewise ordered in terms of the order in the ADC values.

The FSM used to search for the desired pattern will be referred to as an MSFSM. The input words to an MSFSM are constructed by combining a plurality of symbols of adjacent symbol values from a symbol sequence. Consider an MSFSM that has a word size of three symbols. At one processing cycle, the input word to this FSM would be [S(k), S(k+1), S(k+2)]; at the next processing cycle, the input word would be [S(k+3), S(k+4), S(k+5)], and so on. Since the cycle time is essentially independent of the size of the input word, an MSFSM that takes M symbols in its input word can search for the desired pattern M times faster than an FSM that operates on one symbol at a time. However, as noted above, the memory requirements for such an FSM will be significantly greater than the memory requirements for an FSM that operates on a single symbol at each cycle. Accordingly, there is some limit to the size of the input word that can be processed even using techniques that reduce the memory requirements. By using symbols having fewer values than the corresponding ADC sample values, i.e. 12 bits in the above examples, the present invention reduces the memory needed for each state in the FSM, and hence, increases the number of trigger symbols that can be processed in parallel without reaching that memory limit.

Figure 2:
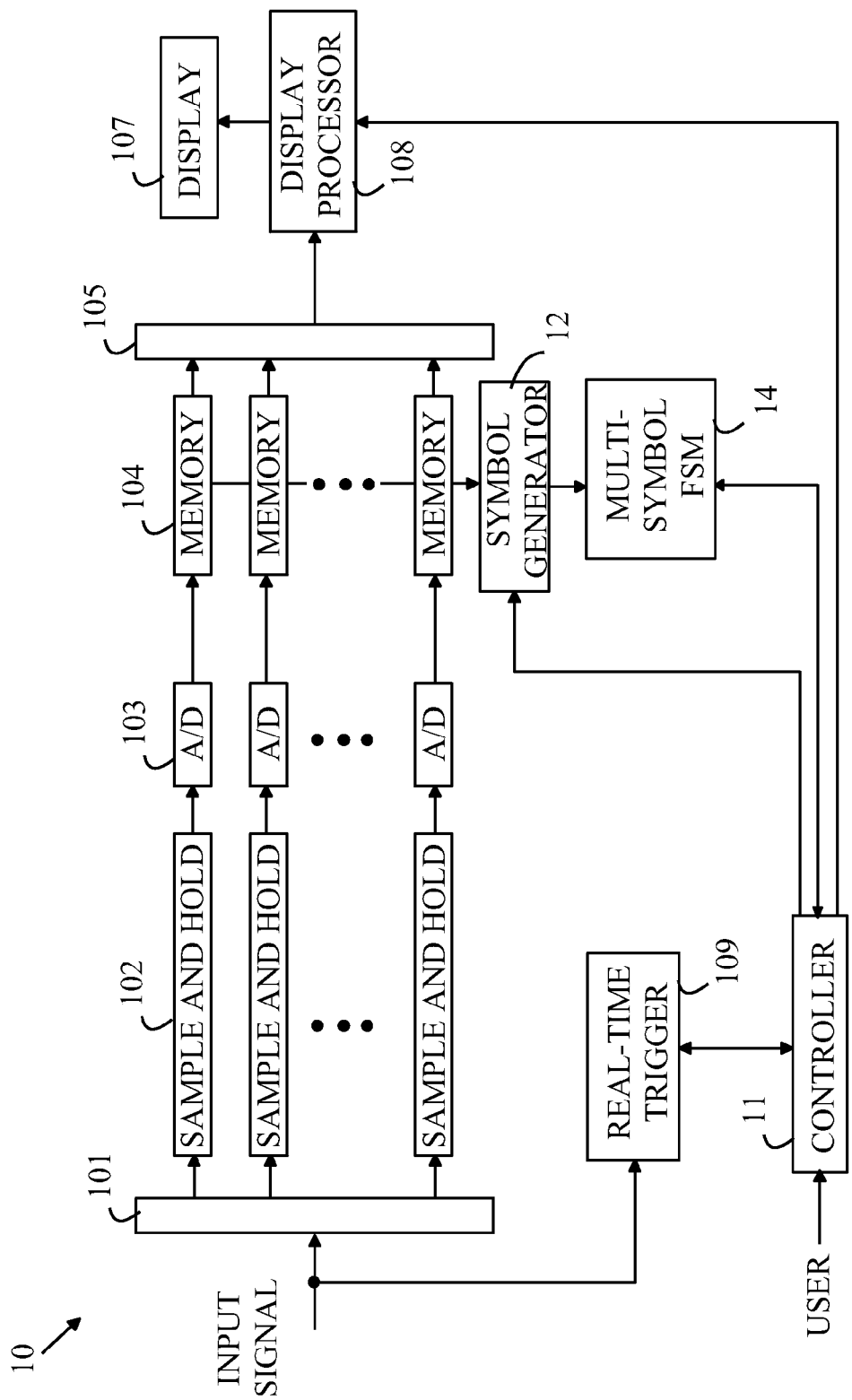
FIG. 2 illustrates one embodiment of a digital oscilloscope according to the present invention.

Refer now to FIG. 2, which illustrates one embodiment of a digital oscilloscope according to the present invention. To simplify the discussion, those elements of digital oscilloscope 10 that perform functions analogous to elements in FIG. 1 have been given the same numeric designation and will not be discussed in detail here. In this embodiment, the MSFSM is used to perform the PAT function while a conventional RTT is used to initiate the PAT search. To simplify the present discussion, it will be assumed that the number of symbols in each input word to MSFSM 14 is equal to the number of memory banks 104. Embodiments in which few symbols are processed in each input word will be discussed in more detail below. In this embodiment, each memory bank is addressed with a common address line, and the ADC value stored at that address is presented on an output bus that is input to symbol generator 12. Since the memories are loaded as data is received from the ADCs, the presented ADC values are in sequential time order, starting with the ADC value presented by memory banks 104. Accordingly, the symbol values generated by the symbol generator will also be in the correct time order. When the multi-symbol input word is assembled, that input word is processed by MSFSM 14. Successive input words are generated by advancing the memory address and processed by MSFSM 14 until the desired pattern is found or until the contents of the memory banks are exhausted. If the pattern is found, controller 11 causes display processor 108 to display the relevant portion of the ADC values in the memories. If the pattern is not found, the RTT is re-armed and new data acquired.

If the input word to MSFSM 14 is smaller than the number of memory banks, then the memory address will not be advanced until each of the memory banks has been read at the current memory address. For example, if there were 16 memory banks and the input words were eight symbols long, the first half of the memory banks would be read at the current address and processed as a first input word. The second half of the memory banks would then be processed at the same address and processed as the second input word. At that point, the memory address would be advanced. In either case, the processing time is significantly faster than the time required by an FSM having a one symbol input word to scan the memory for the desired pattern.

Figure 3:
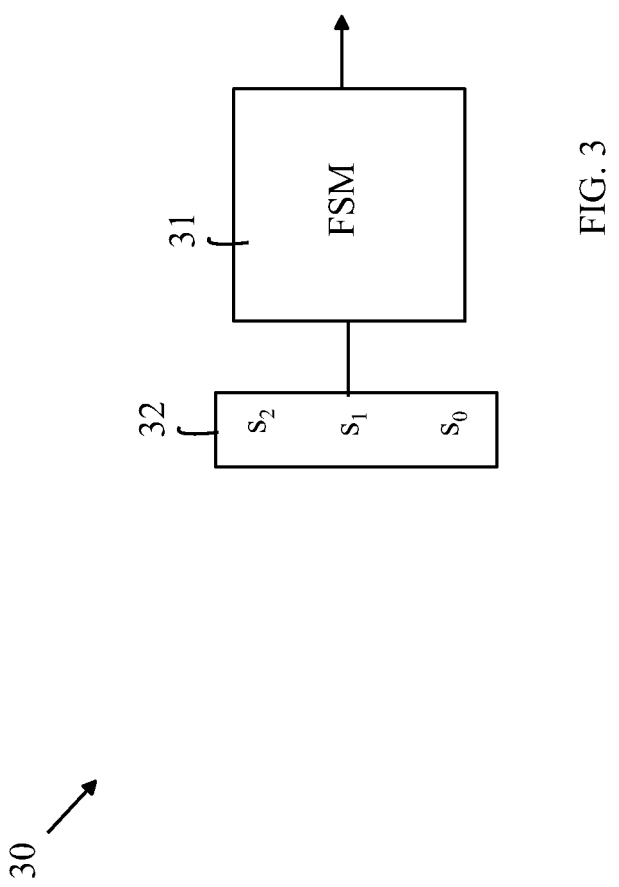
FIG. 3 illustrates a conventional FSM that operates on multiple symbols at each cycle.

There are two types of MSFSMs that could be utilized in the present invention. The first type is a conventional FSM that operates on an input word consisting of a plurality of symbols. Refer now to FIG. 3, which illustrates a conventional FSM that operates on multiple symbols at each cycle. FSM 31 is a conventional FSM whose input word is a plurality of symbols. The hardware to implement such an FSM requires only a single processor. The MSFSM state table is derived from the state table of a single symbol FSM as will be explained in more detail below. In the example shown in FIG. 3, there are three symbols in each input word 32. For the purpose of the present discussion, it is sufficient to note that MSFSM 30 operates at three times the speed of a single symbol FSM; however, this speed improvement is obtained at the expense of a substantially increased memory requirement. Denote the number of states in the FSM by $N_s$, the number of bits in each symbol by $N_{in}$ and the number of symbols in an input word by $N_{sym}$. Then, this first type of FSM has tables with $2^{(N_{in} \times N_{sym})} \times N_s$ entries for each of the $N_s$ states. The memory requirement for these tables can become a significant problem as the number of symbols increases. This memory requirement can be reduced by observing that not all possible entries in these tables are actually used. Such schemes are known to the art, and hence, will not be discussed in detail. However, regardless of the use of these schemes, there is a practical limit to embodiments that utilize a conventional FSM with a multi-symbol input word.

Figure 4:
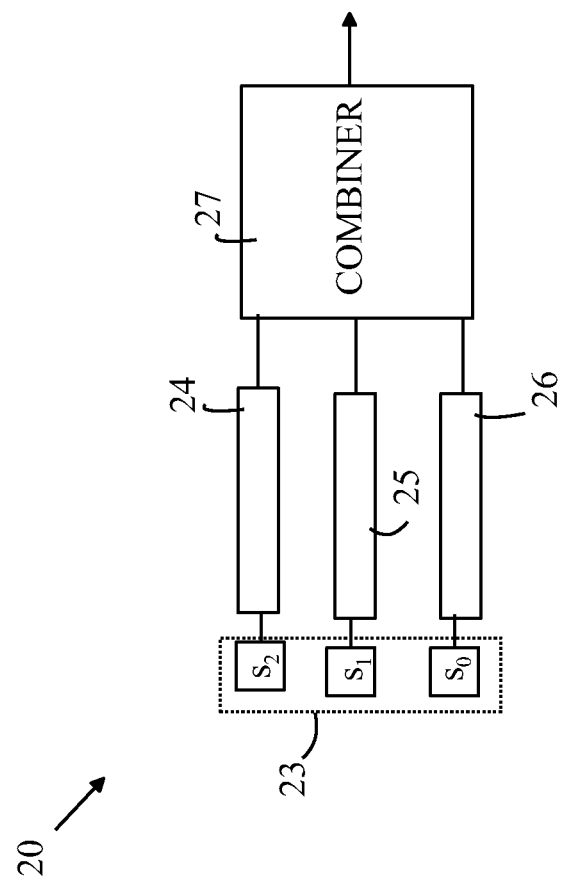
FIG. 4 illustrates an MSFSM that utilizes three parallel processing FSMs for the case in which three symbols are processed in each cycle.

The second type of FSM utilizes a number of smaller FSMs that operate in parallel. Such FSMs can be constructed using programmable gate arrays or computers having multiple cores. Refer now to FIG. 4, which illustrates an MSFSM 20 that utilizes three parallel processing FSMs 24-26 for the case in which three symbols are processed in each cycle. Input word 23 consists of the three symbols $S_0$, $S_1$, $S_2$. Each FSM operates only on the symbol at its input. These FSMs will be referred to as parallel processing FSMs in the following discussion. The state diagram used by each parallel processing FSM is derived from the state diagram for the MSFSM that operates on a three-symbol input word, which, in turn, is derived from the state diagram for a single symbol FSM that implements the regular expression that describes the desired trigger pattern. For the purposes of the present discussion, it is sufficient to note that each parallel processing FSM will generate one or more "match" signals when the sequence of symbols used by that parallel processing FSM causes the parallel processing FSM to enter a particular state, referred to as "match state" or when the parallel processing FSM transitions via an edge that indicates a match. Some of these matches will correspond to the overall sequence of symbols satisfying the trigger pattern. Some of the individual parallel processing FSM matches, however, will be "false alarms", since the parallel processing FSM is not looking at the entire input word.

At the start of a processing cycle, each parallel processing FSM reads its symbol and proceeds to its next state. At the end of the current processing cycle, a parallel processing FSM will generate a match signal if the new state is a "match state". As will be explained in more detail below, when all of the parallel processing FSMs output a match signal in a current cycle, a correct match has been found. In the case of a false alarm, at least one of the parallel processing FSMs will not have generated a match signal. A combiner 27 receives the match signal generated at each processing cycle and determines if all of the parallel processing FSMs have generated a match. If so, combiner 27 outputs a pattern found match signal.

The present invention depends on translating the trigger pattern of interest into a regular expression that can be implemented on an FSM that uses a single symbol as its input word. This FSM will be referred to as the "single symbol FSM" in the following discussion. Once a single symbol FSM is defined for a particular trigger pattern, an FSM that operates on multiple symbols can be derived from that FSM. The manner in which the MSFSM is derived from the base FSM will be discussed in more detail below. This MSFSM will be referred to as the base FSM for the parallel processing FSMs. Given such a base FSM, the state diagrams for the parallel processing FSMs can be derived.

Figure 5:
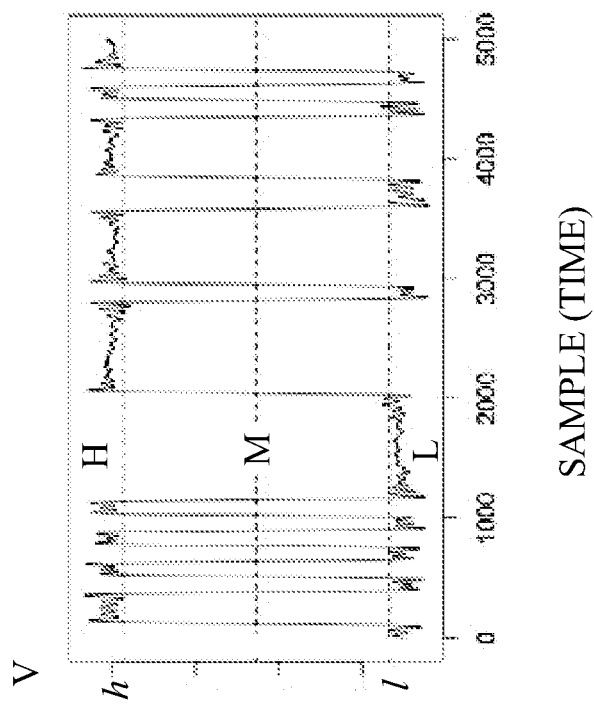
FIG. 5 illustrates a stream of data values that might be output from the ADC section of a digital oscilloscope in response to a two state digital waveform generated by a circuit being observed by the digital oscilloscope.

To facilitate the explanation of this procedure, a simple exemplary system that operates on symbols having three values L, M, and H that are generated from the input signal by the above-discussed algorithm will be utilized. The case in which there are more symbol values will be discussed later. Refer now to FIG. 5, which illustrates a stream of data values that might be output from the ADC section of a digital oscilloscope in response to a two state digital waveform generated by a circuit being observed by the digital oscilloscope. The data values are typically stored in the different memory banks; however, for the purposes of the present discussion, the data values will be treated as a sequence of values in the order at which the input signal was digitized. Each data value is converted to a corresponding symbol value, the $i^{th}$ symbol value in the sequence of symbol values being denoted by S(i). The three symbol values are defined by L if ADC(i)≤l
S(i)=M if ADC(i)≥l and ADC(i)≤h
H if ADC(i)>h where S(i) is the symbol assigned to the $i^{th}$ ADC output value, ADC(i). The threshold values, l and h, are assumed to be given. For example, these values can be part of the trigger specification that is being implemented or specified independently by the user of the digital oscilloscope; the values of l and h can be varied by the user as required. A number of features could be of interest for the waveform shown in FIG. 5. Exemplary features are state transitions, glitches, and runt pulses. A state transition occurs when the waveform, having been established in one of the logic states, switches to the other state and becomes established there. In FIG. 5, the first state transition is near sample 115. A glitch occurs when the waveform, having been established in one logic state, switches to the other state, but not long enough to be considered established there. There are no glitches in FIG. 5. A runt pulse occurs when the waveform, having been established in one logic state, moves into the indeterminate region but then returns to the first logic state without ever having crossed the other logic state threshold. In FIG. 5, two runts are visible near sample 1950, and one runt each near samples 2800 and 4600.

In this three symbol system, a regular expression for a rising edge is "L+M*H", i.e., one or more Ls followed by zero or more Ms followed by an H. Similarly, a regular expression for a falling edge is "H+M*L". A regular expression for either a rising or falling edge is (H+M*L)|(L+M*H). An upward runt pulse satisfies the regular expression "L+M*L", and a downward runt pulse satisfies "H+M*H".

Figure 6:
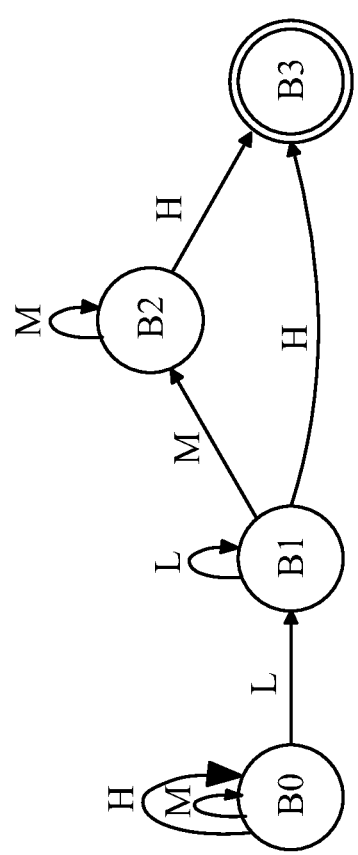
FIG. 6 illustrates an FSM for detecting a rising edge based on a regular expression.
Figure 7:
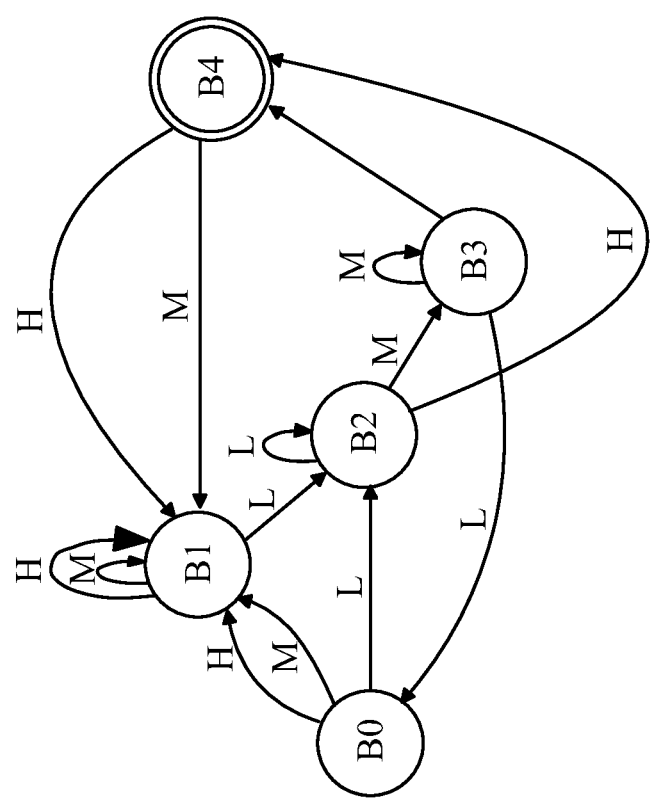
FIG. 7 shows an FSM that fires on each rising edge.

Refer now to FIG. 6, which illustrates an FSM for detecting a rising edge based on the regular expression discussed above. The FSM has no way of knowing the state of the input stream at the point at which the trigger is armed. For the FSM to detect a rising edge, the input stream must be in an L state. At the start, the input stream could be in an M or H state. Accordingly, the regular expression for the rising edge is more accurately written as [^L]*L+M*H. Here "[^L]" denotes any character but L. The FSM starts in an initial state, $B_0$. The FSM remains in $B_0$ until an L is received. This aligns the FSM with the input stream to ensure that the input stream is at a point at which a rising edge could occur. Upon receiving an L, the FSM moves to $B_1$ and remains there until it receives either an M or an H. If an M is received, the FSM moves to $B_2$ where it remains until either an L or an H is received. The L causes the FSM to return to $B_0$. To simplify the following discussion, the return edges to the initial states are omitted from the drawings. Upon receiving an H, the system will move to $S_3$ which is a reporting state as indicated by the double circular lines around the state. The reporting of the rising edge at $B_3$ also disarms the trigger. Hence, the FSM shown in FIG. 6 fires only once, i.e., single trigger mode. An FSM that fires on each rising edge is shown in FIG. 7.

Figure 8A:
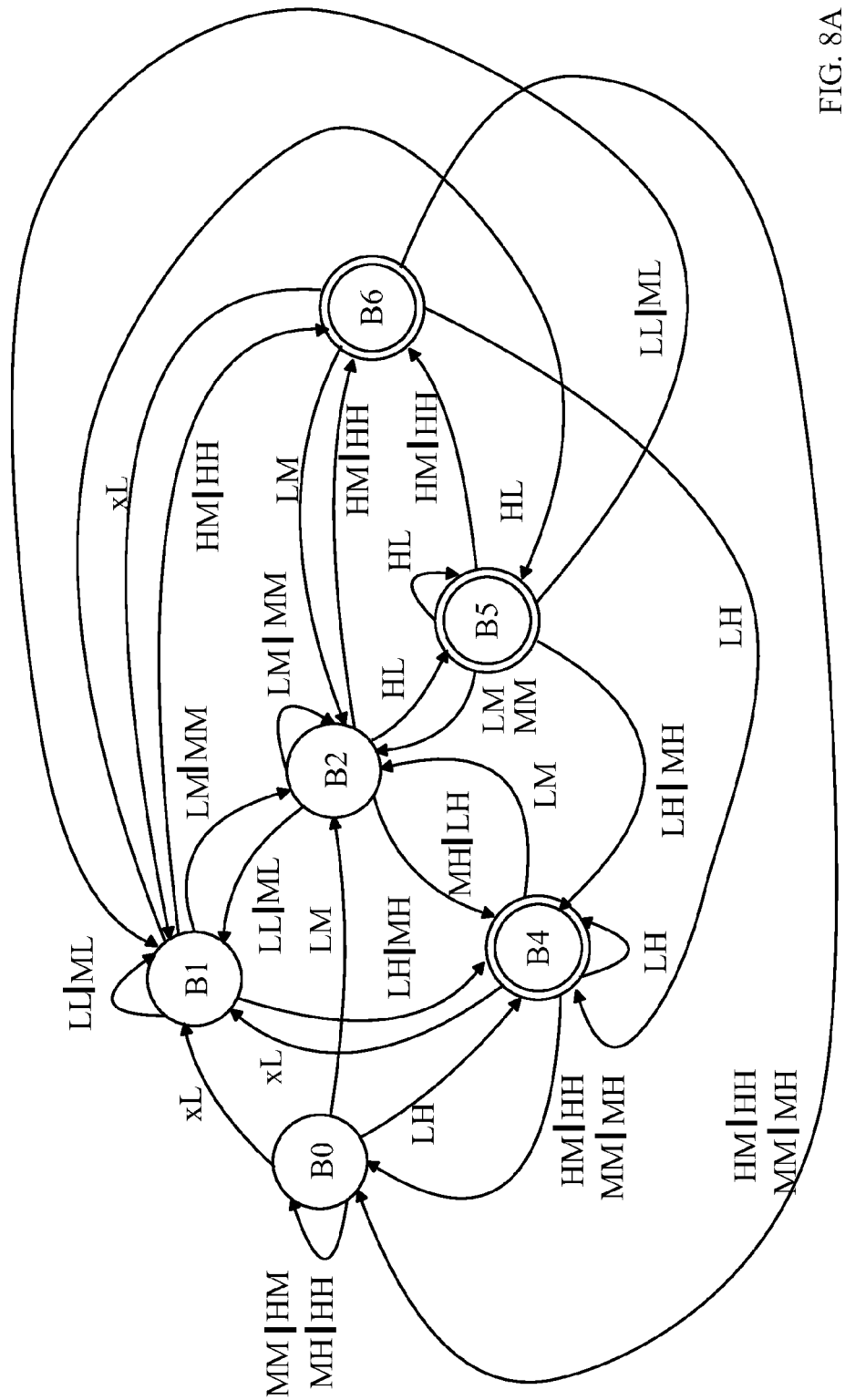
FIGS. 8A-8C illustrate a state diagram for a rising edge trigger two-symbol FSM and state diagrams for parallel processing FSMs derived therefrom.

As noted above, to increase the speed of the trigger determination, it is advantageous to utilize an MSFSM that operates on a plurality of symbols at each cycle. A state diagram for a rising edge trigger two-symbol FSM is shown in FIG. 8A. The input word to the FSM consists of two symbols from the sequence of symbols having values L, M, or H. The input word values can be denoted conveniently by XY, where X is the value of the first symbol and Y is the value of the second symbol. On each cycle of this FSM, two symbols from the symbol stream are loaded into the input word buffer for the FSM. When this input word is processed, the next two symbols are loaded and so on. That is, if one cycle has an input word of $(S_i, S_{i+1})$, then the next cycle processes the input word $(S_{i+2}, S_{i+3})$, where the sequence of symbols is denoted by $S_i$. The various edges in the state diagram shown in FIG. 8A are thus labeled with two successive symbol values such as LL, LM, etc.

While an MSFSM can significantly reduce the time needed to implement a PAT, and hence, reduce the oscilloscope dead time, the time cannot be reduced sufficiently to provide a RTT for a fast oscilloscope. However, it would be even more advantageous to utilize an MSFSM as the RTT. In such cases, the need for the PAT and the accompanying dead time would be removed. To achieve the level of parallel processing needed to implement an RTT, the parallel processing form of an MSFSM is preferred, as memory requirements that limit the first type of MSFSM are less severe, and hence, larger input words, i.e., more symbols, can be processed at each cycle.

As noted above, an MSFSM that takes an input word having multiple symbols can process a sequence of symbols much faster than an FSM that processes the sequence one symbol at a time. However, in constructing an MSFSM, care must be taken to provide the location of the trigger sequence in the original sequence of symbols and account for any remaining symbols in the input word.

Consider the case of a simple two-symbol FSM that executes a search for a rising edge. The trigger sequence is satisfied when the H is received. The H could be the first symbol of the two-symbol input word or the second symbol of the two-symbol input word. In addition, if the trigger is satisfied by the first symbol in an input word, the FSM must take into account the second symbol, as this symbol could be the start of a new trigger sequence. Hence, the case in which the second symbol is an L, and hence, could be the start of another trigger sequence, must be distinguished from the case in which the second symbol is an M or H. Accordingly, the two-symbol FSM must include three separate trigger states to distinguish these three possibilities.

Refer now to FIG. 8A, which is a state diagram for a two-symbol FSM that detects a rising edge. The input word has the form XY, where X is the first symbol in the symbol sequence and Y is the second symbol. To simplify the diagram, an input word of xL denotes any input word that ends with L, i.e., LL, ML, HL. An edge labeled with multiple input words such as HH|HM is satisfied by an input word of HH or HM. The reporting state B4 corresponds to the trigger sequence being satisfied by the second symbol in the current input word. The reporting state B5 corresponds to the trigger sequence being satisfied by the first symbol in the current input word, and the second symbol being an L. The reporting case B6 corresponds to the trigger sequence being satisfied by the first symbol in the current input word, and the second symbol being an M or an H.

As noted above, considerable memory can be saved by replacing an FSM having a large input word with a plurality of parallel processing FSMs that operate on smaller input words. The manner in which the parallel processing FSMs are generated from an MSFSM will now be discussed in more detail using the two-symbol input word FSM shown in FIG. 8A. In this example, each of the parallel processing FSMs operates on a single symbol in the two-symbol input word; however, as will be explained in more detail below, embodiments in which each parallel processing FSM operates on smaller input words can also be constructed.

Since each parallel processing FSM only "sees" one of the two symbols in the input word of the larger two-symbol FSM, that parallel processing FSM cannot determine the state of the two-symbol FSM at any given time other than the beginning of the search. However, the parallel processing FSM can determine a list of possible states in the two-symbol FSM that corresponds to each state in the parallel processing FSM. If one of the states in that list is a reporting state in the parallel processing FSM, the corresponding state in the parallel processing FSM is also a reporting state, and the parallel processing FSM reports the possible corresponding reporting states in the two-symbol FSM. The combiner shown in FIG. 4 compares the list of reporting states from each parallel processing FSM at each cycle. In particular, if both parallel processing FSMs report lists and those lists have a common state in the two-symbol FSM, a match is declared and the common state is reported.

Figure 8B:
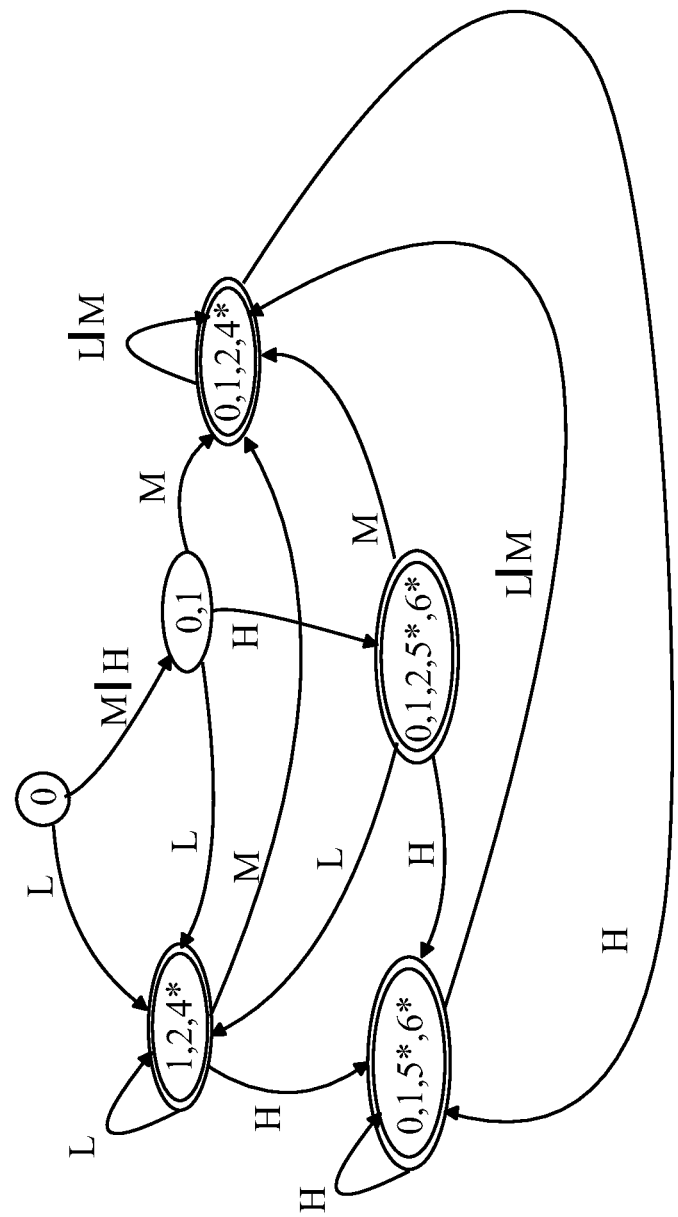

The manner in which the state diagrams for the parallel processing FSMs are constructed can be more easily understood with reference to FIG. 8B, which is the completed state diagram for the parallel processing FSM that operates on the first symbol of the two-symbol input word. It is assumed that when the parallel processing FSM is in state "0" at the beginning of a search, the two-symbol FSM shown in FIG. 8A is in state $B_0$. At each stage of the state diagram generation, a state in the parallel processing FSM that has not yet been examined is explored by assuming that the parallel processing FSM receives a particular input symbol value (L, M, or H) while being in that state. The states in the two-symbol FSM that would result from each of the two-symbol FSM states in the list corresponding to that state are then determined. If the list is different from the lists in the currently defined states in the parallel processing FSM, a new state is created. If not, the input symbol being explored merely connects to an existing state. The process is terminated when no new states remain in the parallel processing FSM.

Consider the case in which the parallel processing FSM is in state 0 and the parallel processing FSM receives an L as its input symbol. The two-symbol FSM is in state $B_0$ in this case, and the two-symbol FSM could have received an input word LL, LM, or LH. Hence, the state diagram of the two-symbol FSM is examined to determine the final states that would arise from each of these three possibilities. If the two-symbol input word was LL, then the two-symbol FSM would proceed to state $B_1$; if the two symbol input word was LM, the two-symbol FSM would have moved to state $B_2$, and if the two-symbol input word was LH, the two-symbol FSM would have moved to state $B_4$ which is the reporting state. The reporting states are identified by an "*". Hence, the list associated with the new state in the parallel processing FSM is $B_1$, $B_2$, $B_4$*. To simplify the drawing, the B's have been omitted from the lists in FIG. 8B. That is, the list is shown as "1,2,4*".

The process is now repeated with state 0 in the parallel processing FSM and an input character of M. This leads to a state "0, 1". When the process is repeated for an input character of H to state 0, a state with the same list is also obtained; hence, no new list is created and the edge is marked as having two tokens "M|H".

As noted above, the process is repeated with each new non-explored state in the parallel processing FSM. Consider the case of the state "0,1". When the parallel processing FSM receives an L, all of the states in the two-symbol FSM that can be reached from states $B_0$ and $B_1$ in the two-symbol FSM with an input of LL, LM, or LH are determined. In this case, the list of states is "1, 2, 4*", which has already been seen.

The final state diagram for the parallel processing FSM that operates on the first symbol is shown in FIG. 8B. It should be noted that when this parallel processing FSM reports a match, only the possible match states in the two-symbol FSM are reported. For example, when the state marked "1, 2, 4*" is entered, the parallel processing FSM reports "4*".

Figure 8C:
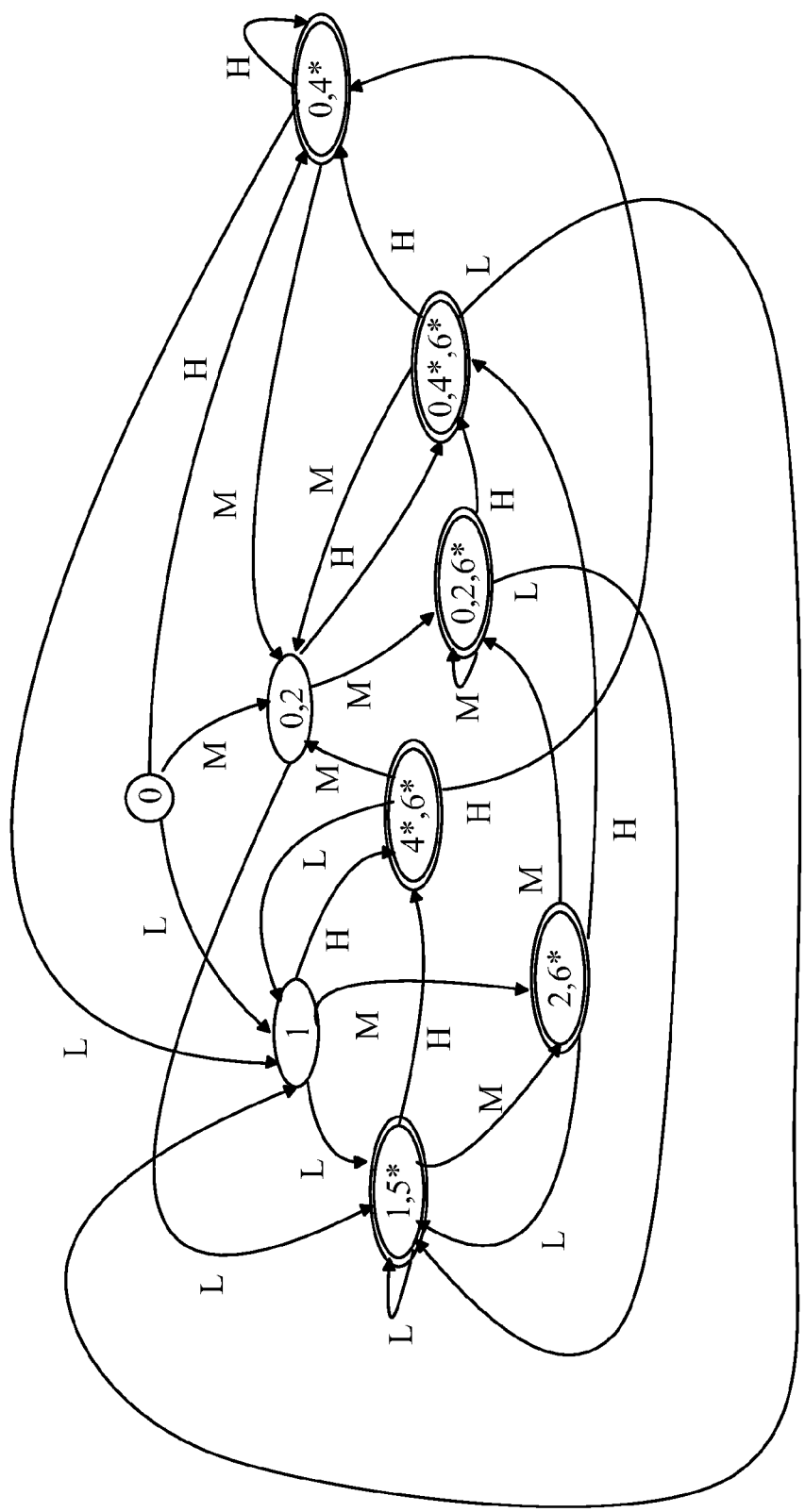

Refer now to FIG. 8C, which is the final state diagram for the parallel processing FSM that operates on the second symbol of the two symbol input word to the two-symbol FSM. This state diagram is generated using the same process as described above with respect to the state diagram shown in FIG. 8B; however in this case when the parallel processing FSM receives a symbol of L, the states that can be reached in the two-symbol FSM with input words of LL, ML, and HL are determined.

In the example discussed above with respect to FIGS. 8A-C, the parallel processing FSMs operated on one corresponding symbol in the larger input word of the two-symbol FSM. However, embodiments in which each parallel processing FSM operates on an input word that is different from one symbol can also be constructed. Consider the case in which the symbols each have four values, and hence, are conveniently represented by a two-bit symbol. The input word to the two-symbol FSM would have eight bits. An embodiment in which eight parallel processing FSMs are used with each parallel processing FSM operating on a corresponding one of the eight bits could also be constructed. Such an embodiment can further reduce the memory requirements.

As noted above, it would be advantageous to utilize the MSFSM as an RTT instead of a PAT with reduced processing time. If the number of symbols that can be processed in parallel is sufficiently large, such embodiments can be constructed. The required processing ability of the MSFSM will depend on the particular digital oscilloscope. Lower speed digital oscilloscopes require an RTT that runs at a few 100 MHz up to 4 Ghz; a high speed digital oscilloscope can require an MSFSM that runs at speeds up to 100 GHz.

Figure 9:
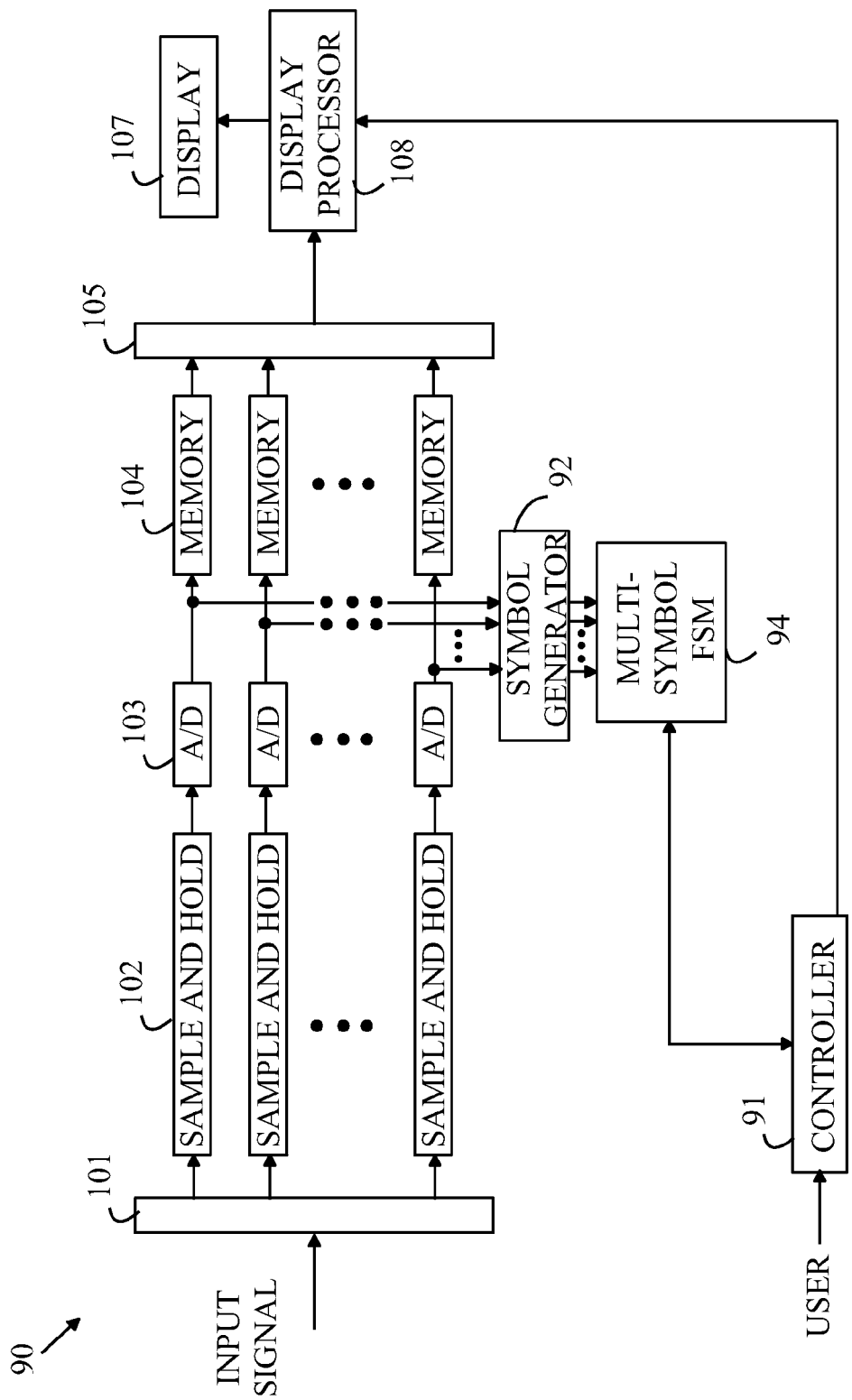
FIG. 9 illustrates a digital oscilloscope in which an MSFSM is used as an RTT.

Refer now to FIG. 9, which illustrates a digital oscilloscope in which an MSFSM is used as an RTT. To simplify the discussion, those elements of digital oscilloscope 90 that serve functions analogous to elements of digital oscilloscope 10 discussed above will not be discussed in detail here. In digital oscilloscope 90, the output of each ADC is copied to symbol generator 92 which generates the symbol corresponding to each output and latches that symbol into an input register in MSFSM 94. When the last ADC value is received and converted, MSFSM 94 processes the input symbols to determine if a match to the desired search pattern has been found. If a match is found, controller 91 causes display processor 108 to display the relevant part of the data that is stored in the memory banks. The trigger pattern can be specified by the user by selecting from one of a plurality of predetermined trigger patterns provided by controller 91 or by inputting a regular expression describing the desired trigger pattern. In the later case, controller 91 includes the software to generate the corresponding state tables from the regular expression input by the user.

If the MSFSM is an FSM based on a plurality of parallel processing FSMs, the processing of each symbol in the input can begin as soon as the symbol is received, rather than waiting for all symbols from the ADCs to arrive at the MSFSM. As noted above, each parallel processing FSM operates independently of the other parallel processing FSMs and only operates on one of the symbols. Hence, as soon as that symbol arrives, the parallel processing FSM can process the symbol and report any matches. The matches from the various parallel processing FSMs in the MSFSM are accumulated by the combiner in the MSFSM that finishes the processing when the last parallel processing FSM is finished with its symbol. This type of staggered processing can be advantageous when the various parallel processing FSMs are implemented in custom chips, as not all of the parallel processing FSMs are simultaneously requesting access to memory in the custom chip.

Figure 10:
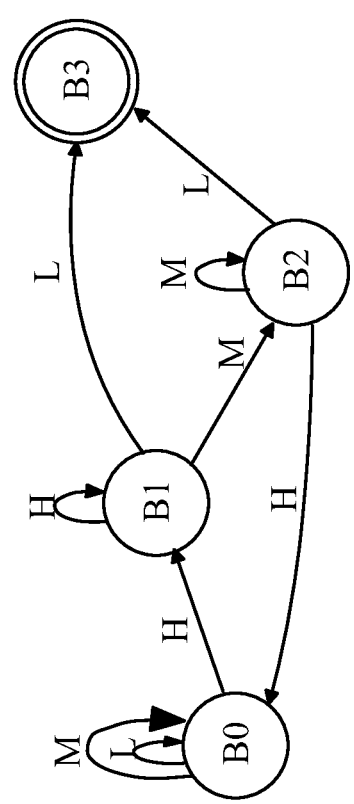
FIG. 10 illustrates a base FSM for implementing an embodiment of a falling edge trigger.
Figure 11:
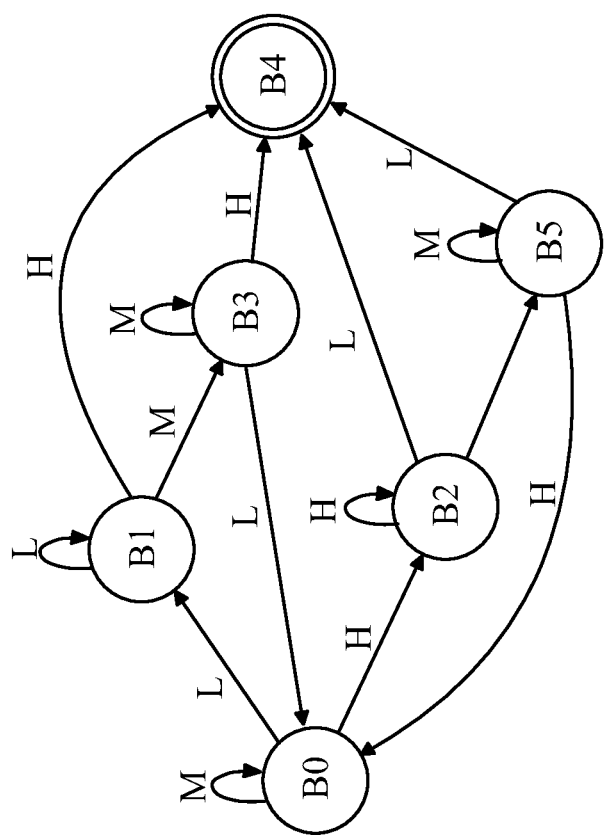
FIG. 11 shows a base FSM for implementing an embodiment of a rising or falling edge trigger.
Figure 12:
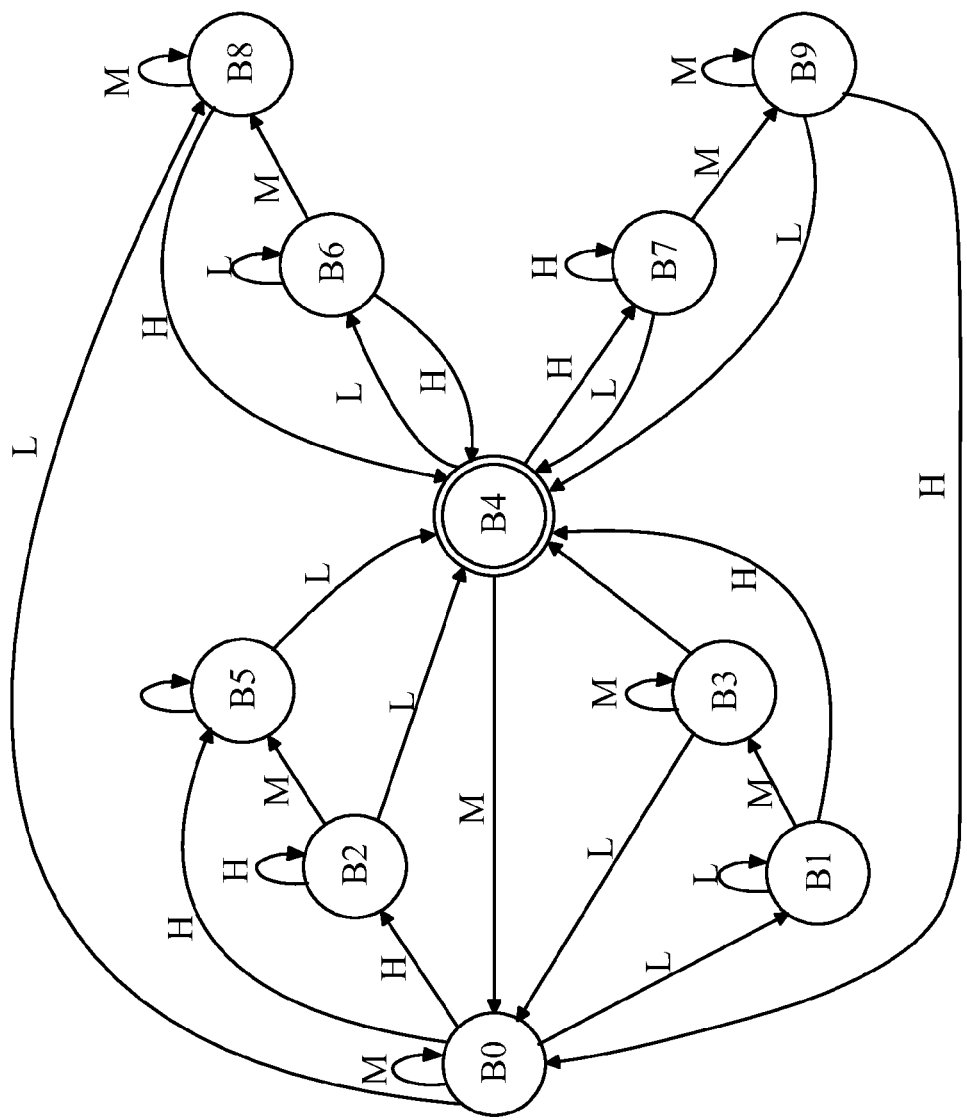
FIG. 12 illustrates a base FSM for implementing an embodiment of a continuously firing rising or falling edge trigger.

The above-described examples utilize a trigger based on a rising edge in an embodiment using symbols having three states. It should be noted that other conventional RTTs can also be implemented using this simple three-state symbol embodiment. For example, a trigger fired by a falling edge is defined by the regular expression [^H]*H+M*L in a single trigger mode. A base FSM for implementing this embodiment of a falling edge trigger is shown in FIG. 10. A trigger that fires on either a rising or falling edge in a single firing mode is defined by the regular expression M*((L+M*H)|(H+M*L)). A base FSM for implementing this embodiment of a rising or falling edge trigger is shown in FIG. 11. A continuous trigger that fires on a rising or falling edge is defined by the regular expression M*((L+M*H)|(H+M*L))+. A base FSM for implementing this embodiment of a continuously firing rising or falling edge trigger is shown in FIG. 12. Having two triggers active in a single FSM, for example having separately definitions of [^L]*(L+M*H) and [^H]*(H+M*L) will also cause a trigger on a rising or falling edge but since there are two separate definitions it is possible to differentiate which edge was observed whereas the single expression M*((L+M*H)|(H+M*L)) will recognize the same inputs but does not allow that differentiation to occur.

Figure 13:
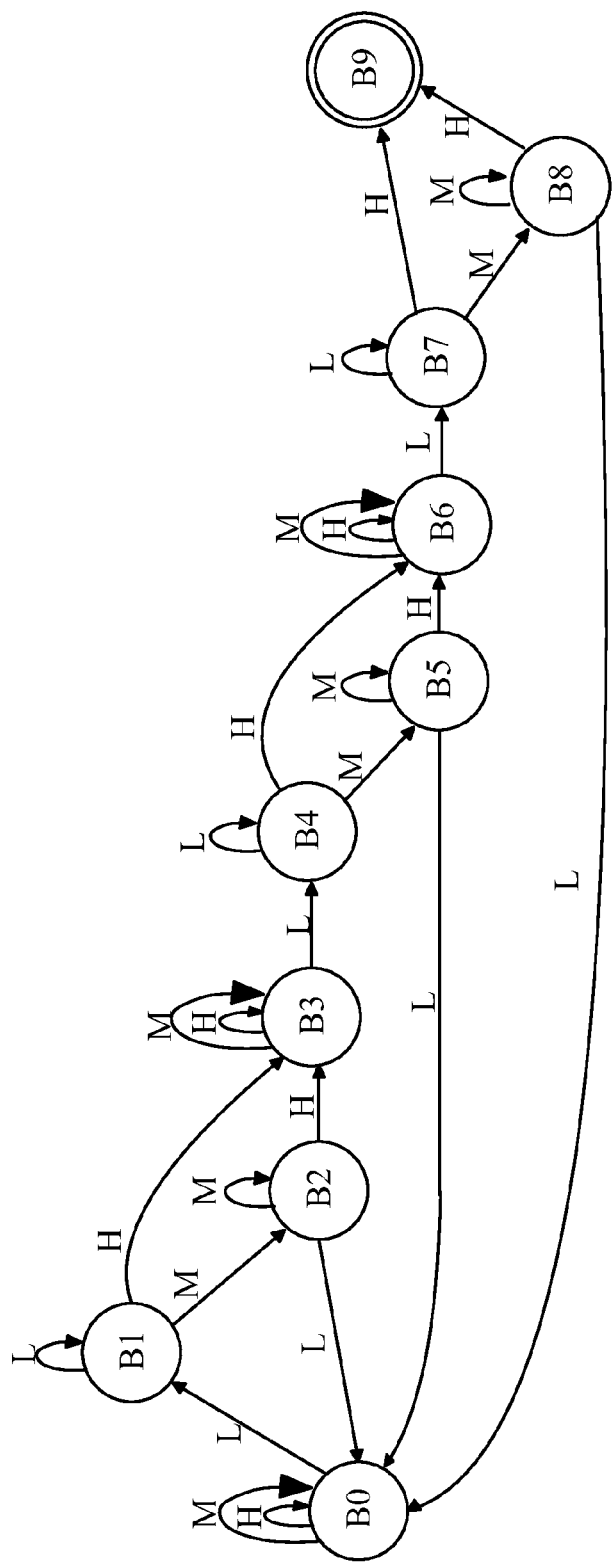
FIG. 13 illustrates a base FSM that implements the regular expression ([^L]*(L+M*H)){n} for the case n=3.
Figure 14:
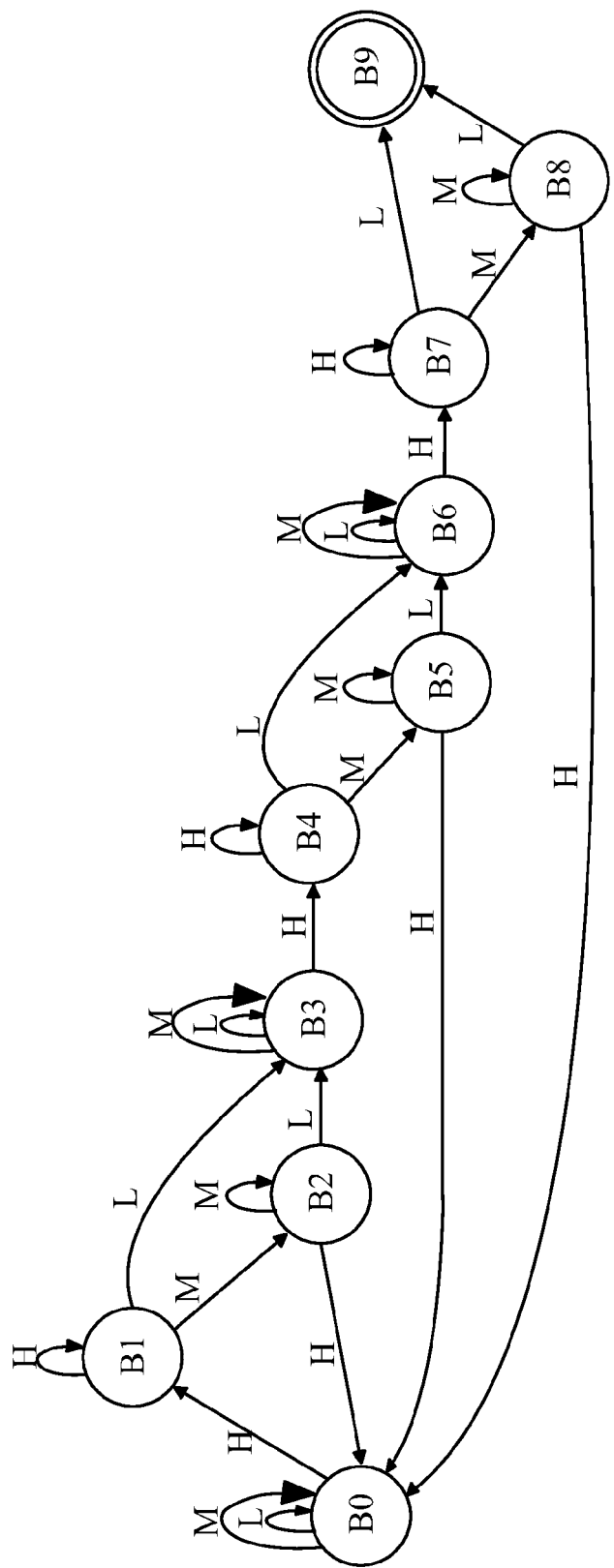
FIG. 14 illustrates a base FSM that implements the regular expression ([^H]*(H+M*L)){n} for the case n=3.

Another class of triggers that can be implemented with the present invention in real time is referred to as "edge then edge" triggers. This class of triggers includes triggers that are armed on a first event such as an edge trigger and then fire on the occurrence of a second event, e.g., another edge trigger that occurs after some specified intervening time period or other events have occurred. Two sub-classes of this type of trigger are referred to as "delay by events" and "delay by time" triggers. For example, in a delay by events trigger using edge triggers, the trigger is armed when the next edge is detected. After a specified number of edge triggers are detected in the armed state, the trigger fires. A trigger that fires on a rising edge after n rising edges have been detected can be specified in terms of a regular expression by ([^L]*(L+M*H)){n}. A base FSM that implements the regular expression ([^L]*(L+M*H)){n} for the case n=3 is shown in FIG. 13. Similarly, a trigger that fires after n falling edges can be specified in terms of a regular expression by ([^H]*(H+M*L)){n}. A base FSM that implements the regular expression ([^H]*(H+M*L)){n} for the case n=3 is shown in FIG. 14.

Figure 15:
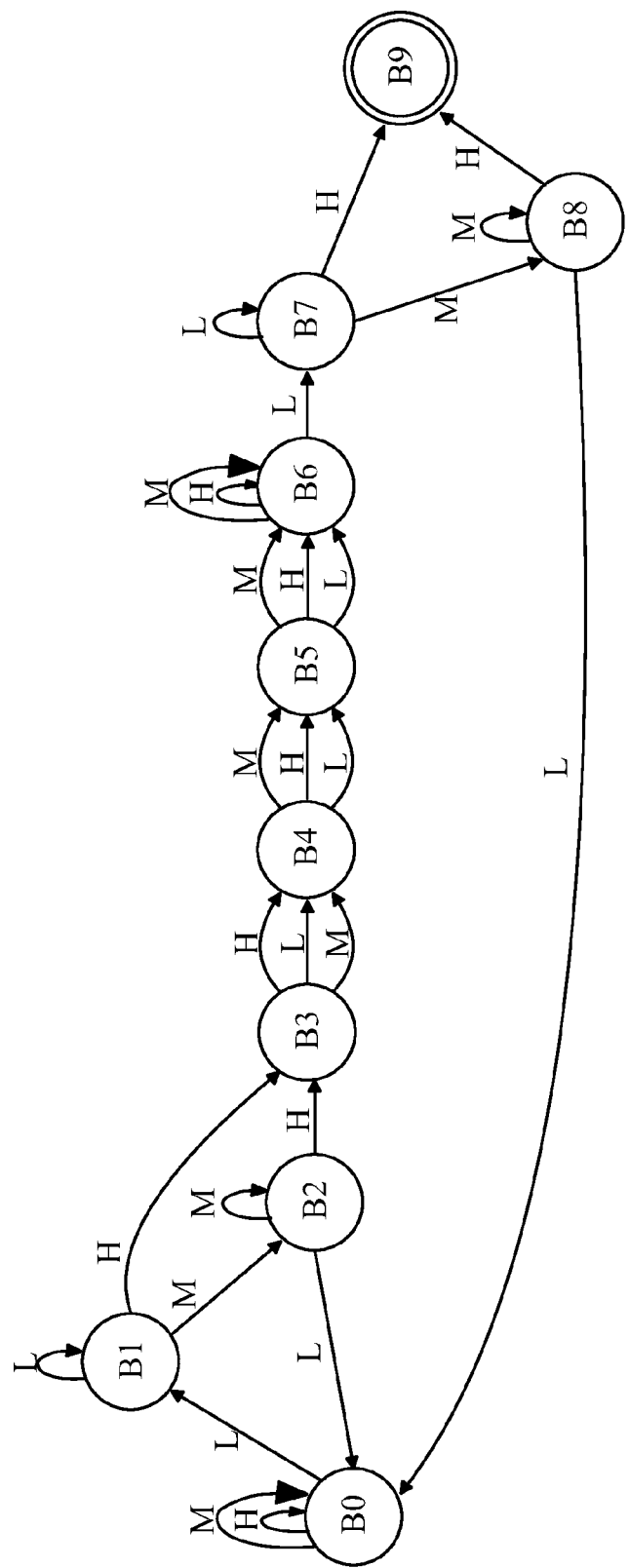
FIG. 15 illustrates a base FSM that implements the regular expression (L+M*H)(L|M|H){n}(L+M*H) for the case n=3 and an edge transition trigger.

A delay by time trigger is implemented by counting the number of samples as a proxy for time. For example, a rising edge delayed by n samples followed by another rising edge can be represented by the regular expression (L+M*H)(L|M|H){n} (L+M*H). The state (L|M|H) is a don't care state and could also be specified as the character class [LMH]. A base FSM that implements the regular expression (L+M*H)(L|M|H){n} (L+M*H) for the case n=3 is shown in FIG. 15. To reduce the length of the FSM, a counter arrangement with a clock could be utilized so that the counting is not done by adding states to the FSM. In such an embodiment, the system is armed by the first trigger firing, i.e., an edge of the appropriate type being detected. The system then counts n clock cycles using a counter that is separate from the FSM. After the counter signals completion, the trigger is armed a second time. Alternatively, a single state in the FSM that has an associated counter could be used for the don't care state. This type of state loops back to itself until the count is satisfied. Such states are implemented in counter extended FSMs, which are known to the art, and hence, will not be discussed in detail here.

Other examples of events delayed by n events or events delayed by time can be constructed. To simplify the discussion, the following shorthand notation is used:

Rising Edge=R=L+M*H
Falling Edge=F=H+M*L
Don't care=".".=L|M|H=[LMH]

A number of rising edges followed by a falling edge becomes R{5}L or between five and ten rising edges and a falling edge becomes R{5,10}L. Operators such as {n,} match at least n times or abstemious operators, for example, {n,m}? match at least n times but no more than m times can also be employed. In addition, a combination of events such as F{5}R{10}—five falling edges followed by ten falling edges can be implemented. In another example, a combination of time and events can be implemented. For example F{5}.{n}R=five falling edges then a delay corresponding to n samples, and then a second rising edge. As noted above, delay by time can also be implemented with a timer. In such a system, the first falling edge starts the timer, the timer would then count the required number of clock cycles and arm the trigger for the rising edge. When the rising edge is seen, the trigger fires.

Figure 16:
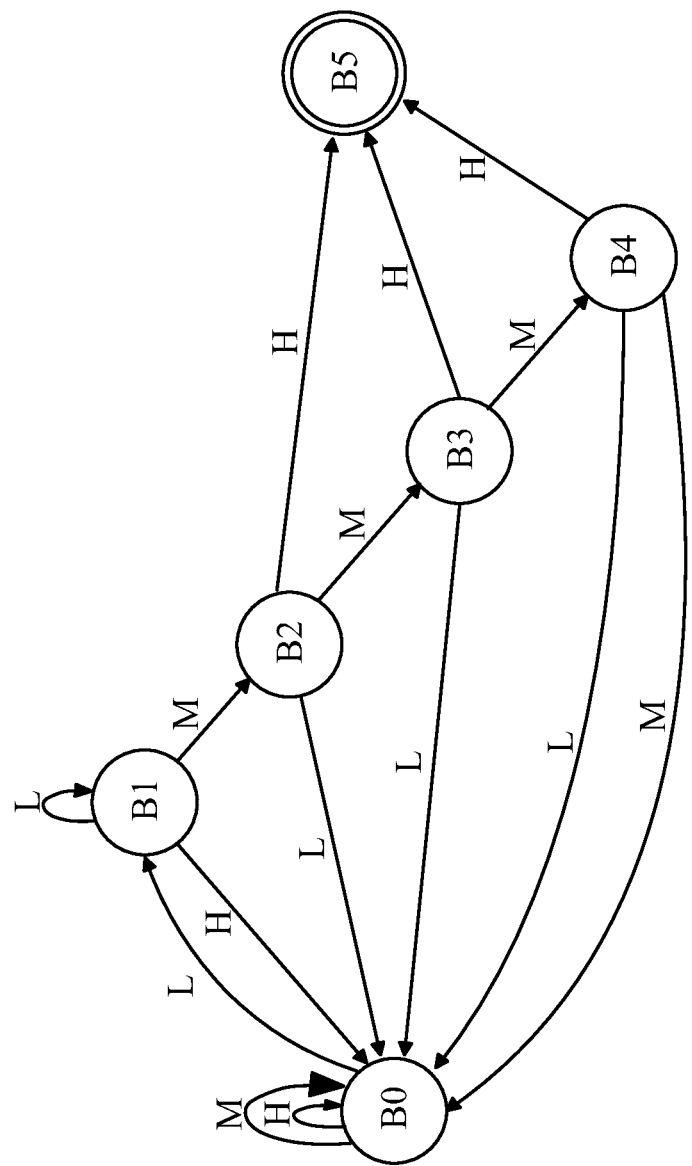
FIG. 16 illustrates an FSM for implementing regular expression L+M{n,m}H for the case in which n=1 and m=3.

Triggers based on the slope of an edge can also be implemented in the present invention. The regular expression "L+M{n,m}H" defines a trigger based on the slope of the waveform where n is the lower boundary and m is the upper boundary. This type of trigger can be configured to provide a trigger based on a number of samples or times. In the case in which n=1, this trigger would fire if the edge is less than m samples long. An FSM for implementing regular expression L+M{n,m}H for the case in which n=1 and m=3 is shown in FIG. 16.

Figure 17:
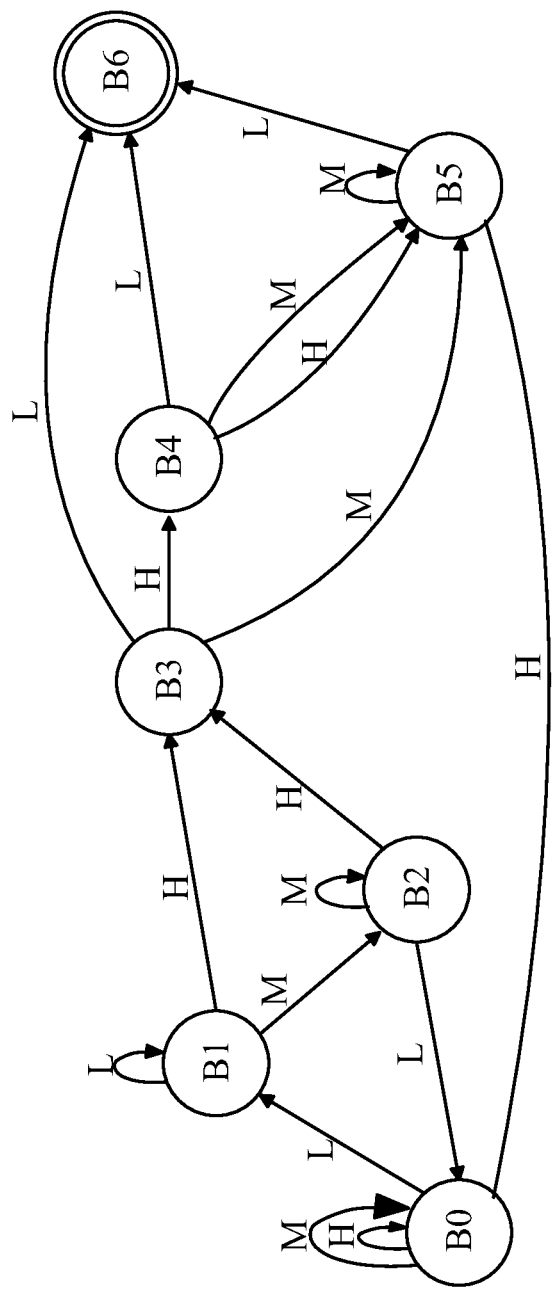
FIG. 17 illustrates an FSM that implements the regular expression [^L]*L+M*H{1,m}M*L for the case m=3 and a positive glitch.
Figure 18:
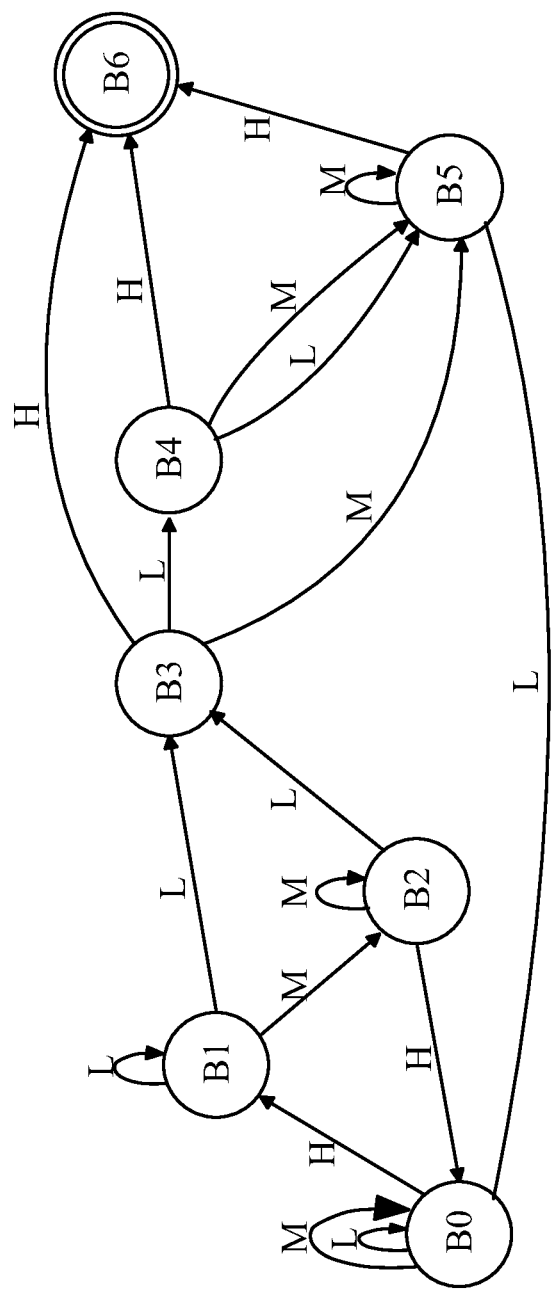
FIG. 18 illustrates an FSM that implements the regular expression [^H]*H+M*L{1,m}M*L for the case m=3 and a negative glitch.

Another trigger of interest is referred to as a "glitch trigger". A glitch is defined to be a pulse that is narrower than some predetermined pulse width of a particular polarity (negative or positive). A positive glitch of defined width can be represented by the regular expression [^L]*L+M*H{1,m}M*L, where m is the maximum width of the glitch. An FSM that implements the regular expression [^L]*L+M*H{1,m}M*L for the case m=3 is shown in FIG. 17. A negative glitch can be represented by the regular expression=[^H]*H+M*L{1,m}H*L. An FSM that implements the regular expression [^H]*H+M*L{1,m}H*L for the case m=3 is shown in FIG. 18.

Figure 19:
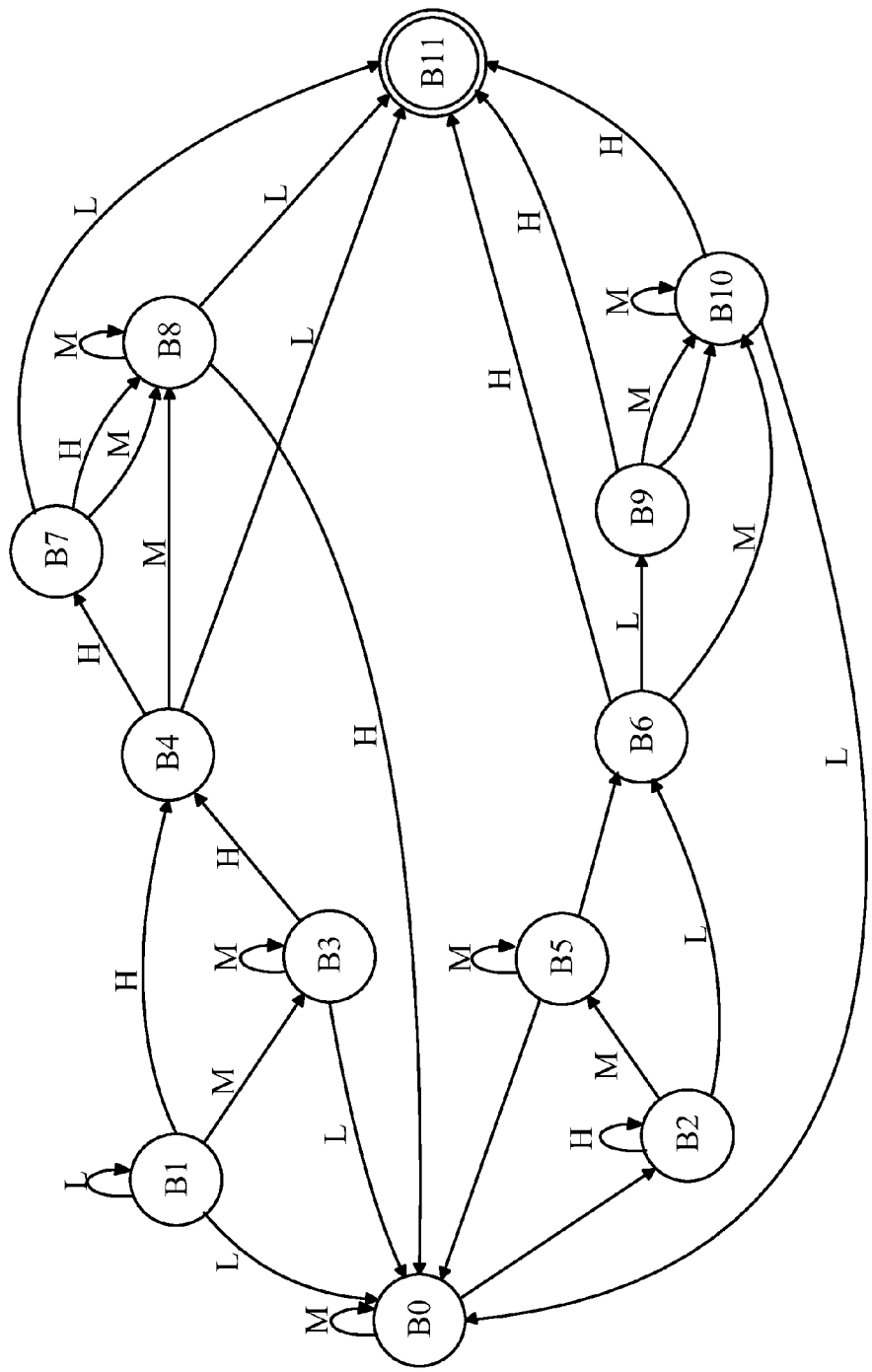
FIG. 19 illustrates an FSM that implements the regular expression M*((L+M*H{1,n}M*L)|(H+M*L{1,m}M*H)) for the case n=m=3, and a positive or negative glitch.

More complex glitch triggers can also be implemented. For example, a trigger for glitches that lie between certain widths that support greater than, less than and between. In addition, a trigger that simultaneously searches for both a positive and negative glitch that has a certain glitch width in samples can be implemented. For example, the regular expression M*((L+M*H{1,n}M*L)|(H+M*L{1,m}M*H)) defines a trigger that fires on a positive glitch of n samples or less and a negative glitch of m samples or less. An FSM that implements the regular expression M*((L+M*H{1,n}M*L)|(H+M*L{1,m}M*H)) for the case n=m=3 is shown in FIG. 19.

Figure 20:
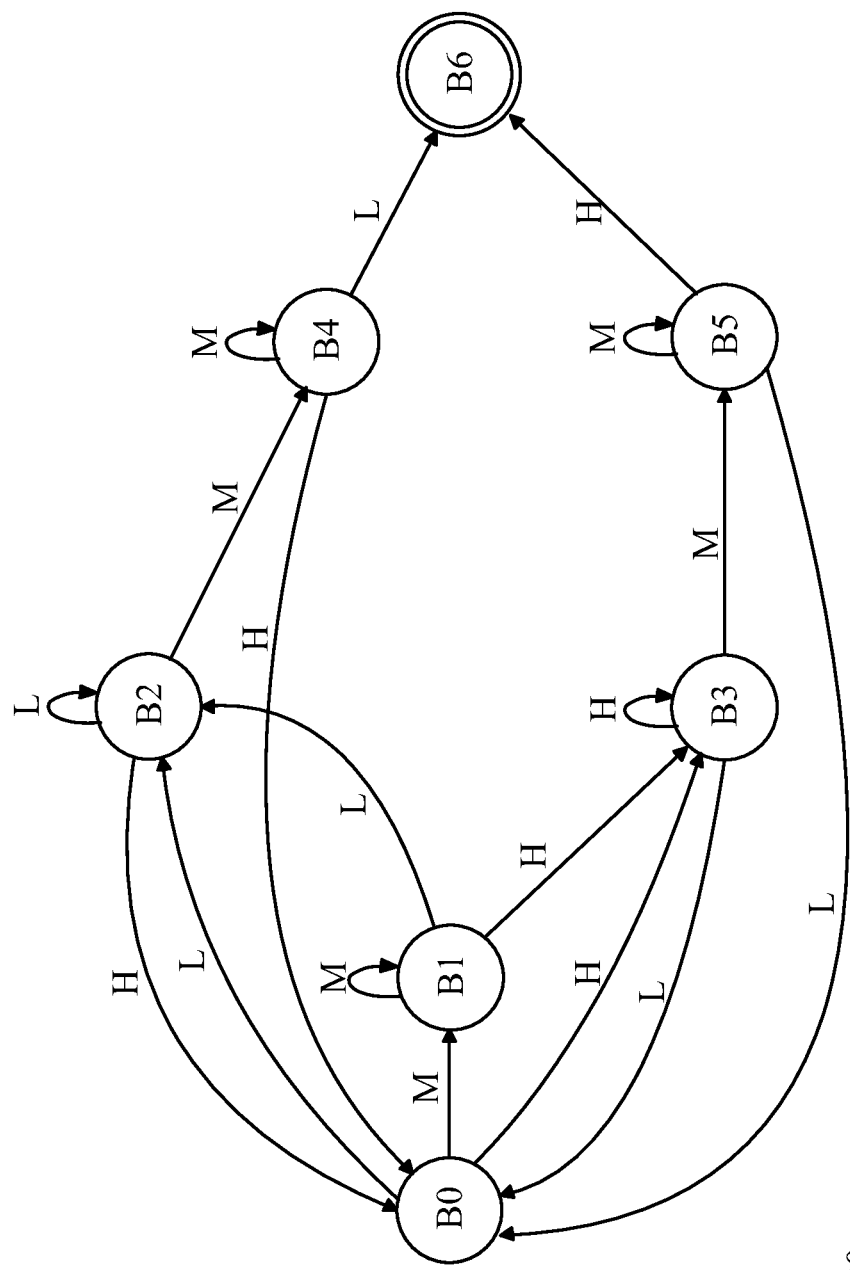
FIG. 20 illustrates an FSM that implements the regular expression [M]*(L+M+L)|(H+M+H) to implement a runt trigger.

Another trigger of interest is referred to as a "runt trigger". A positive runt is defined to be a pulse that starts as an L but does not reach the H threshold before returning to L. Similarly, a negative runt is defined to be a pulse that starts as an H but does not reach the L threshold before returning to H. A trigger that fires on either a positive or negative runt is defined by the regular expression [M]*(L+M+L)|(H+M+H). An FSM that implements the regular expression [M]*(L+M+L)|(H+M+H) is shown in FIG. 20.

The above-described examples utilize a system in which the output of the ADC is converted to a string of symbols in which each symbol has three values. However, embodiments in which the symbols have a larger number of values can also be utilized. For example, the output of the ADC could be divided into five ranges corresponding to symbols L, $M_1$, $M_2$, $M_3$, and H. In one example, if an 8-bit ADC is used, these ranges could be defined as follows:

L=[0x00-0x20]
$M_1$=[0x21-0x60]
$M_2$=[0x61-0xa0]
$M_3$=[0xa1-0xde]
H=[0xdf-0xff]

Figure 21:
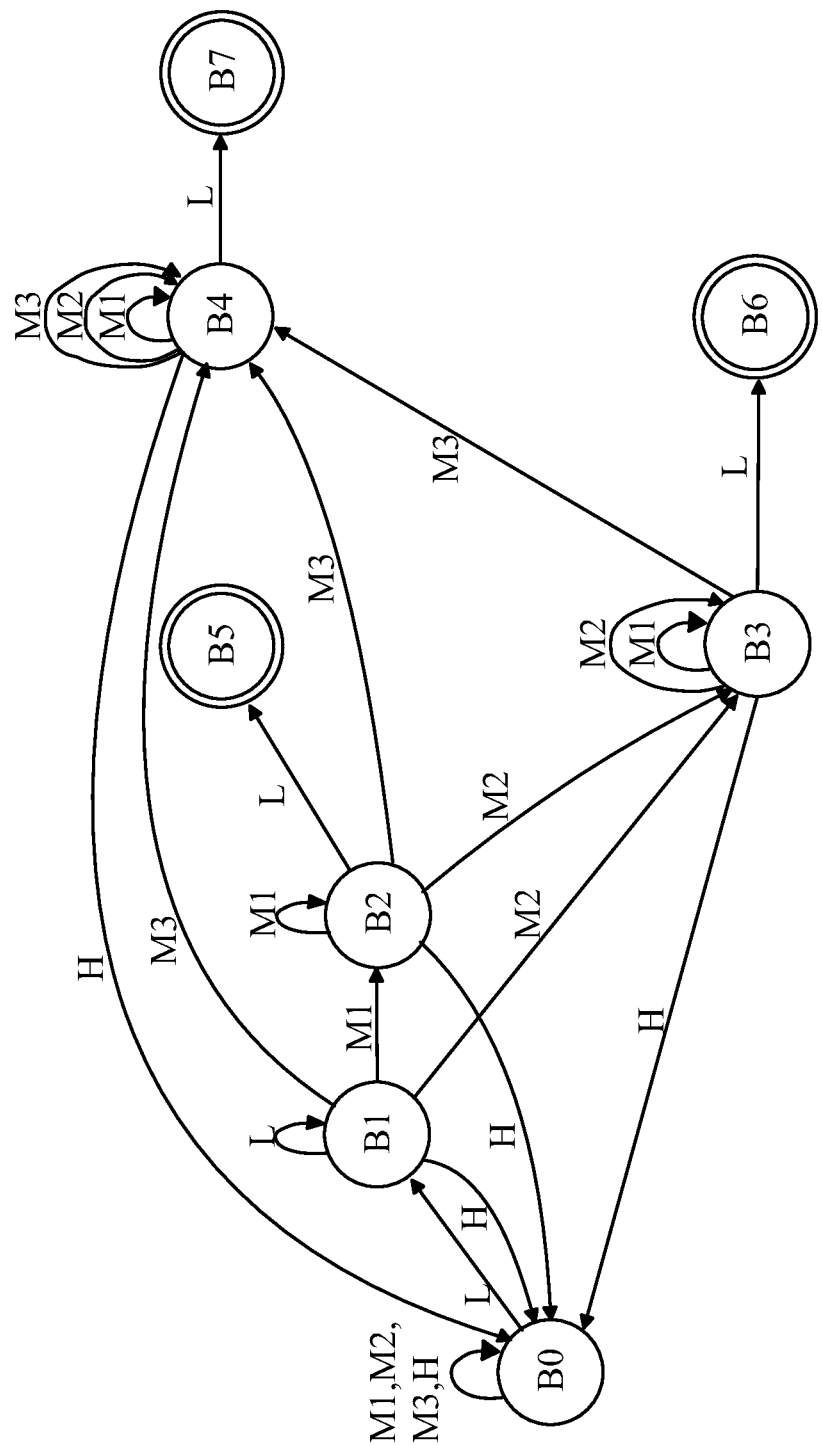
FIG. 21 illustrates an FSM for implementing a tri-level runt trigger and reports the encountered runt level.

Consider a trigger for a runt in such a system. Different levels of runts could then be the basis of triggers. Three runt triggers would be able to identify runts at different levels. For example, the three triggers could be defined by the regular expressions: [^L]*L+$M_1$+L, [^L]*L+[$M_1M_2$]+L, and [^L]*L+[$M_1M_2M_3$]+L. An FSM for implementing a tri-level runt trigger that fires on one of these triggers and reports the encountered runt level is shown in FIG. 21.

The symbols typically represent ranges of values from the ADC. In the simplest case, each symbol represents a range of equal size. If the number of symbols in the symbol set is a power of two, the conversion of the ADC values to symbols can be accomplished by merely selecting the most significant bits of the ADC output. For example, if there are 16 symbols and the ADC outputs 12 bit values, each symbol value is obtained by copying the most significant four bits of the ADC values. However, embodiments in which the symbol values represent unequal ranges of ADC values can also be constructed. In such embodiments, a series of comparators can be used to make the symbol assignments.

Figure 22:
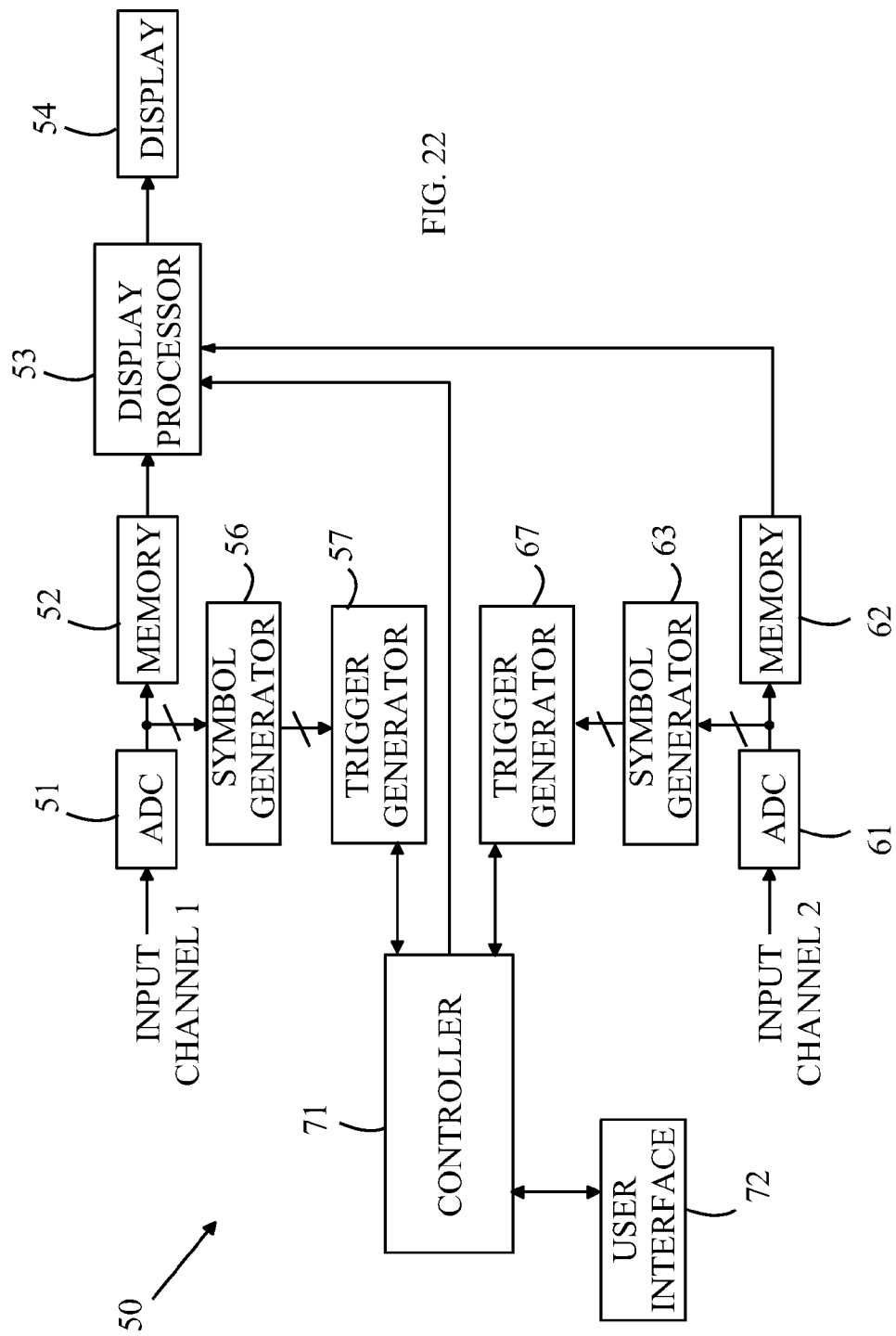
FIG. 22 illustrates a two-channel digital oscilloscope according to one embodiment of the present invention.

The above-described embodiments are single channel embodiments; however, embodiments having a plurality of channels can also be constructed. Refer now to FIG. 22, which illustrates a two-channel digital oscilloscope. Digital oscilloscope 50 includes a first channel which operates in a manner analogous to the single channel embodiments discussed above. The first channel includes ADC bank 51 which digitizes samples from the input to channel 1 and stores the digitized values in memory bank 52. The first channel also includes a symbol generator 56 that converts the outputs of ADC bank 51 to a set of symbols having one symbol for each value generated by ADC bank 51. The symbols from symbol generator 56 are input to trigger generator 57 that includes an MSFSM. The second channel includes ADC bank 61 whose values are stored in memory bank 62. The second channel also includes a symbol generator 63 that generates a set of symbols from the outputs of ADC bank 61. The symbols from symbol generator 63 are processed by trigger generator 67 that also includes an MSFSM.

The specific trigger patterns used by trigger generators 57 and 67 are loaded into the MSFSMs by controller 71 that includes a library of predefined trigger types. A user of digital oscilloscope 50 selects the desired trigger type using a user interface 72. For example, the controller can present the user with a list of trigger types. The user then selects the trigger type of interest and specifies any parameters such as the values of n and m discussed above. Controller 71 then generates the memory tables used by the MSFSMs in the trigger generators.

In one aspect of the present invention, controller 71 also provides the user with an editor that allows the user to define a custom trigger by inputting a regular expression that defines the trigger condition desired by the user. In such embodiments, controller 71 includes a compiler that converts the regular expression to the corresponding tables for the MSFSMs in the corresponding trigger generator.

When active, the trigger generators send the reports from the various parallel processing FSMs to controller 71. When the desired trigger is detected, controller 71 operates display processor 53 to cause display 54 to display the corresponding portions of the signals recorded in memory banks 52 and 62. It should be noted that the final trigger event that triggers the display may depend on triggers from both channels being triggered.

Triggering on noisy waveforms presents additional challenges that can be overcome using a triggering system according to the present invention. Consider a repetitive signal that is corrupted by noise. Ideally, the oscilloscope display would only trigger on the desired waveform and would present successive traces such that the traces are aligned on the time axis when the trigger criterion is set to capture the waveform in question. However, because of the noise, the trigger condition may be satisfied by the noise, rather than the underling signal. For example, a trigger that fires on a leading edge can trigger because of a noise spike. Each time the trigger fires, the PAT trigger must process the data to determine if the signal is the desired signal. The RTTs can fire numerous times on noise spikes that are then rejected by the PAT. However, a large number of false positive triggers further increases the dead times resulting from the PAT processing of the waveforms stored in response to the RTT.

Even when the RTT fires and the PAT determines that a desired trigger criterion has been met, the trigger may be satisfied at slightly different times on successive traces. As a result, the successive traces "jump" back and forth on the display.

To reduce false triggers, prior art triggering circuits use filtering and hysteresis to reduce the problems caused by noise. These triggering circuits are analog comparators that fire when the signal exceeds a threshold. To avoid the problem of multiple firings on the same noisy wave, hysteresis is introduced into the trigger circuitry. The triggers are set such that a trigger will not fire a second time until the signal returns to a level that is significantly below the current firing threshold. In addition, the trigger circuitry views the incoming signal through a low-pass filter that attenuates the noise. However, there is a trade-off between noise suppression and frequency response of the triggering circuit.

The filters are typically analog filters for fast oscilloscopes, since digital filters that operate at the speeds in question present significant challenges. The analog circuitry is difficult to alter and has limited functionality. Hence, it would be advantageous to provide a more flexible triggering scheme that provides functions analogous to the analog filtering and hysteresis to reduce the jitter introduced by noise in the input signal.

The FSM triggers of the present invention can provide the desired functions. Ideally, a trigger according to the present invention would be used for the RTT to reduce the number of false positives that are forwarded to the PAT to resolve. However, even when a trigger according to the present invention is used in the PAT, the present invention provides significant improvements, since the PAT can more clearly differentiate between the desired pattern and a pattern resulting from noise.

First, it should be noted that the transformation of the sequence of ADC values to the sequence of symbols having much fewer states tends to suppress noise, as noise spikes seldom cause the symbol state to change. Noise will typically result in the symbol state changing at points in the sequence near those at which the underlying signal would have switched symbol states in the absence of noise. As will be discussed in more detail, complex trigger patterns can differentiate between the desired signal and noise, and hence, reduce false triggers.

Second, by using more complex triggering patterns, an improvement that is analogous to the hysteresis of prior art analog systems can also be realized.

Consider a trigger that is to fire on a rising edge in the input signal. As noted above, a simple rising edge trigger is specified by the regular expression:

Rising Edge=[^L]*(L+M*H)

That is, the trigger occurs when any symbol that is not 'L' is seen any number of times, followed by one or more symbols (+) that are 'L', followed by any number of 'M' followed by at least one H. Unfortunately, this simple trigger is still subject to false triggers due to noise if a threshold is crossed very briefly before the true trigger is observed For example, an input of digital samples that translate to the sequence of symbols "HMLLLLMMH" clearly defines a rising edge as specified by this trigger pattern.

Now consider the sequence "HMLLLLMMHMHHH". The trigger would fire on the first MMH seen after the series of L symbols on a rising edge. The following MHHH would then be ignored even though there a transition to an H because the waveform has not gone back through L. This might not be the desired behavior. Alternatively, noise could have caused a transition to H in the middle of the rising edge; in this case, the trigger fired three samples prior to the correct firing point. The later case would then introduce jitter into the displayed waveforms as subsequent copies of the data waveform appear with varying amounts of noise.

By using a trigger pattern that depends on a longer history within the symbol sequence, a more reliable and reproducible trigger can be obtained. The history serves the function of an analog filter to distinguish noise triggers from the desired trigger. For example, the trigger [^L]*(L+M*H) only fires on the first transition to 'H' after the sequence of Ls in "HMLLLLMMHMHHH". In contrast, analog triggers typically consider each threshold crossing in isolation, and hence, allow two separate trigger events to occur, i.e., a trigger is generated on each MH transition in the symbol sequence.

In one aspect of the invention, a trigger pattern that counts the number of times a symbol must repeat to define a trigger is used. In the case of a rising edge, false noise triggers in which the signal advances to the H state briefly due to noise during a sequence of M states can be reduced by requiring that the signal be in the high state for at least some predetermined time. For example, a trigger for a rising edge can be defined by

[^L]*L+M*H{10}

This trigger pattern requires that the signal be in the high state for at least ten samples. Since the samples are generated at a known rate, the trigger pattern is equivalent to requiring that the signal remain high for a predetermined period of time after transitioning from the low state. The following input sequence would not be a trigger despite it conforming to the original definition of a rising edge given above [^L]*(L+M*H) because it has not yet been high for ten samples: LMHHHHHMMMMMHHHHHH.
However, the sequence:
LMMHHMMHHHHHHHHHHH
would fire the trigger. Since noise could interrupt the required sequence of H symbols, i.e., high states, the following alternative trigger could be used to allow the signal to dip back to M and then return to H:

[^L]*L+M*(H{10}|H{1,9}M±H{10}).

Hence, using trigger patterns in which a count of the number of times the symbol is in a given state provides improved noise immunity.

It should also be noted that using a similar reset pattern in the trigger pattern provides immunity from noise causing the trigger to fire multiple times. For example, the trigger pattern

[^L]*L{10}M*(H{10}|H{1,9}M+H{10})

requires the signal to return to the low state for ten samples before the trigger can fire again. For the purposes of the present discussion, a "settling sequence" will be defined to be a sequence before or after a trigger pattern of interest that is added to the trigger sequence to ensure that the digital value sequence has returned to a predetermined state before a second trigger can occur.

It should be noted that a trigger according to the present invention could be used to implement the current analog RTT based on an analog comparator that fires when the signal that fires crosses a threshold $V_{TH}$ and then waits until the signal crosses a lower threshold, $V_{TL}$ before re-arming. In this case, the symbol L is assigned for signal values below $V_{TL}$; the symbol H is assigned to signal values above $V_{TH}$, and the symbol M is assigned for voltages that are greater than or equal to $V_{TL}$ and less than or equal to $V_{TH}$. Given these symbol assignments, the following trigger definition defines an FSM that implements such an RTT: M*(L|((L|M])*)?H)|

Figure 23:
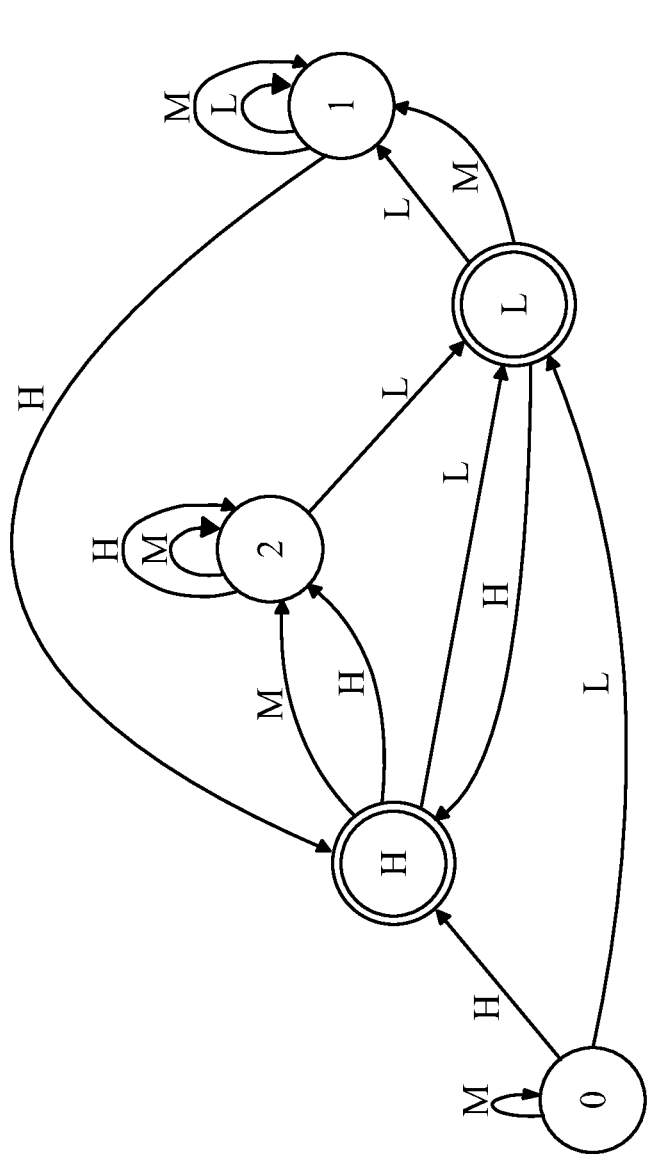
FIG. 23 illustrates a state diagram for implementing the search pattern M*(L|((L|M])*)?H)|(H|((M|H)*)?L).

(H|((M|H)*)?L). A state diagram for an FSM that implements this regular expression is shown in FIG. 23.

While the above-described embodiments of the present invention have utilized digital oscilloscopes as the instruments using the triggers, a trigger processor according to the present invention could be utilized in a much larger class of instruments. For example, a frequency analyzer could use a trigger processor according to the present invention to determine a sequence of signal values that are to be used in computing a frequency spectrum for the signal or a logic analyzer.

In the above-described embodiments that utilize parallel processing FSMs, the parallel processing FSMs operate on input words consisting of one symbol. However, parallel processing FSMs that operate on other sized input words can also be utilized, including parallel processing FSMs that operate on input words that are smaller than a symbol. Consider the case in which the symbols have 16 values, i.e., each symbol has four bits. An FSM that operates on a 4-bit input word can also be transformed into two parallel processing FSMs that each operate on a different two bits of the symbols. In addition, the 4-bit input FSM could be transformed into four parallel processing FSMs that each operate on a different bit of the symbol. The advantage of the smaller input word parallel processing FSMs lies in the potential for reduction in the amount of memory needed for the tables of the FSMs.

The above-described embodiments of the present invention have been provided to illustrate various aspects of the invention. However, it is to be understood that different aspects of the present invention that are shown in different specific embodiments can be combined to provide other embodiments of the present invention. In addition, various modifications to the present invention will become apparent from the foregoing description and accompanying drawings. Accordingly, the present invention is to be limited solely by the scope of the following claims.

What is claimed is:

1. An apparatus comprising:
an input port configured to receive an analog signal that varies as a function of time and to generate an ordered sequence of digital values therefrom;
a symbol generator that generates an ordered sequence of symbols from said ordered sequence of digital values, said symbol generator generating one symbol corresponding to each of said digital values, wherein said digital values are characterized by a number of possible digital value states and said symbols are characterized by a number of possible symbol states, said number of possible symbol states being less than said number of possible digital value states; and
an FSM characterized by an input word, and a plurality of FSM states, said FSM changing from a current one of said plurality of FSM states to another one of said plurality of FSM states that is determined by said input word and said current one of said plurality of FSM states in response to a cycle signal being received;
a controller that causes said FSM to search for a pattern in said ordered sequence of symbols, said controller loading said input word with a plurality of said symbols, generating said cycle signal, and coupling said cycle signal to said FSM.

2. The apparatus of claim 1 wherein said FSM is an MSFSM.

3. The apparatus of claim 2 wherein each symbol represents a corresponding range of said digital values.

4. The apparatus of claim 3 wherein said corresponding range is characterized by a number of digital values in that corresponding range and wherein said number of digital values for each corresponding range is the same.

5. The apparatus of claim 2 wherein said symbols are characterized by a number of possible symbol states and wherein said number of possible symbol states is less than or equal to 16.

6. The apparatus of claim 5 wherein said number of possible symbol states is less than or equal to three.

7. The apparatus of claim 2 wherein said input port comprises:
a digital sequence generator that receives said analog signal and generates said ordered sequence of digital values; and
a memory that receives said ordered sequence of digital values and said apparatus further comprises
a display processor that generates a display based on said ordered sequence of digital values in said memory, said display being generated in response to said MSFSM generating a signal indicating that said MSFSM entered a predetermined state.

8. The apparatus of claim 7 further comprising a user interface, and a library comprising a plurality signal patterns, each signal pattern specifying a set of states for said MSFSM, one of said plurality of signal patterns being selected by input from a user of said apparatus through said user interface.

9. The apparatus of claim 7 wherein said symbol generator receives each digital value generated by said digital sequence generator prior to said ordered sequence of digital values being stored in said memory.

10. The apparatus of claim 7 wherein said symbol generator receives said ordered sequence of digital values from said memory in response to a command from said controller.

11. The apparatus of claim 10 further comprising a trigger generator that receives said analog signal and generates a trigger signal responsive to a pattern in said analog signal, said controller causing said MSFSM to search for a predetermined pattern in said ordered sequence of symbols in response to said trigger signal.

12. The apparatus of claim 7 wherein said digital sequence generator comprises a plurality of ADC channels, each ADC channel comprising an ADC and a memory module, said plurality of ADC channels sampling said analog signal in a predetermined order and storing a digital value generated by said ADC in that ADC channel in said memory module in that ADC channel, and wherein said input word is loaded with symbols generated from digital values that were generated by different of said plurality of ADC channels.

13. The apparatus of claim 2 wherein said MSFSM comprises a plurality of parallel processing FSMs.

14. The apparatus of claim 13 wherein each of said plurality of parallel processing FSMs has an input word that is one of said symbols in said input word of said MSFSM.

15. The apparatus of claim 1 wherein said FSM is a counter extended FSM.

16. The apparatus of claim 1 wherein said pattern defines a rising edge or a falling edge in said ordered sequence of digital values.

17. The apparatus of claim 16 wherein said pattern further requires that said ordered sequence of symbols comprises a settling sequence before or after said rising edge or said falling edge.

* * * * *